(12) United States Patent
Woo et al.

(10) Patent No.: US 11,228,013 B2
(45) Date of Patent: Jan. 18, 2022

(54) ANISOTROPIC NANOROD-APPLIED LIGHT-EMITTING DIODE AND LIGHT-EMITTING DEVICE INCLUDING THE SAME

(71) Applicant: LG Display Co., Ltd., Seoul (KR)

(72) Inventors: Sung-Il Woo, Paju-si (KR); Dong-Young Kim, Paju-si (KR); Hye-Ock Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/165,691

(22) Filed: Oct. 19, 2018

(65) Prior Publication Data

US 2019/0123292 A1     Apr. 25, 2019

(30) Foreign Application Priority Data

Oct. 20, 2017 (KR) .................. 10-2017-0136359

(51) Int. Cl.
*H01L 51/50* (2006.01)
*H01L 27/32* (2006.01)
(Continued)

(52) U.S. Cl.
CPC ...... *H01L 51/5072* (2013.01); *H01L 51/0007* (2013.01); *H01L 51/502* (2013.01);
(Continued)

(58) Field of Classification Search
CPC ............... H01L 51/5072; H01L 51/502; H01L 51/0007; H01L 51/56; H01L 27/3244;
(Continued)

(56) References Cited

U.S. PATENT DOCUMENTS

| 2007/0045620 A1* | 3/2007 | Park | G09G 3/3233 |
| | | | 257/40 |
| 2011/0079796 A1* | 4/2011 | Wober | H01L 27/14 |
| | | | 257/82 |

(Continued)

FOREIGN PATENT DOCUMENTS

| CN | 102971805 A | 3/2013 |
| CN | 103730584 A | 4/2014 |

OTHER PUBLICATIONS

Shariffudin et al., "Hybrid Organic-Inorganic Light Emitting Diode using ZnO Nanorods as Electron Transport Layer", Jan. 9, 2014, IEEE, RSM 2013 IEEE Symposium on Micro and Nanoelectronics, pp. 340-343 (Year: 2014).*

*Primary Examiner* — Robert T Huber
(74) *Attorney, Agent, or Firm* — Birch, Stewart, Kolasch & Birch, LLP

(57) ABSTRACT

The present disclosure relates to a light-emitting diode including a first electrode and a second electrode facing each other; an electron transfer layer between the first electrode and the second electrode; and a light emitting material between the first electrode and the second electrode, wherein the electron transfer layer consists of anisotropic nanorods, and the long axes of the anisotropic nanorods are arranged at an angle of about 20 degrees to about 90 degrees with respect to an interface with an adjacent layer into which electrons are injected.

18 Claims, 13 Drawing Sheets

(51) Int. Cl.
*H01L 51/00* (2006.01)
*H01L 51/56* (2006.01)
(52) U.S. Cl.
CPC .......... *H01L 51/56* (2013.01); *H01L 27/3244* (2013.01); *H01L 51/5004* (2013.01); *H01L 2251/303* (2013.01); *H01L 2251/5353* (2013.01); *H01L 2251/5369* (2013.01); *H01L 2251/552* (2013.01); *H01L 2251/556* (2013.01); *H01L 2251/558* (2013.01)
(58) Field of Classification Search
CPC ....... H01L 2251/303; H01L 2251/5353; H01L 2251/5369; H01L 2251/556
USPC ...................................... 257/40, 76, E33.013
See application file for complete search history.

(56) References Cited

U.S. PATENT DOCUMENTS

| | | | |
|---|---|---|---|
| 2011/0281070 A1* | 11/2011 | Mittal | H01L 31/1884 428/142 |
| 2013/0038178 A1* | 2/2013 | Sohn | H01L 21/02554 310/367 |
| 2016/0028035 A1* | 1/2016 | Yang | H01L 51/5056 257/40 |
| 2018/0331312 A1* | 11/2018 | Pan | C09D 11/03 |

* cited by examiner

ANISOTROPIC NANOROD-APPLIED LIGHT-EMITTING DIODE AND LIGHT-EMITTING DEVICE INCLUDING THE SAME

CROSS-REFERENCE TO RELATED APPLICATIONS

This application claims the priority benefit under 35 U.S.C. § 119(a) of Korean Patent Application No. 10-2017-0136359, filed in the Korean Intellectual Property Office on Oct. 20, 2017, which is incorporated herein by reference in its entirety.

BACKGROUND OF THE INVENTION

Field of the Invention

The present disclosure relates to a light-emitting diode, and more particularly, to a light-emitting diode having improved luminescence properties and a light-emitting device including the same.

Discussion of the Related Art

Various flat panel display devices have been developed as it is possible for these devices to display a large amount of image data. Among flat panel display devices, an organic light-emitting diode (OLED) display device and a quantum dot light-emitting diode (QLED) display device can have a thin film structure and low power consumption, and thus, have attracted attention as next-generation display devices that replace liquid crystal display (LCD) devices." "Such an OLED or QLED may have elements on a flexible transparent substrate such as a plastic substrate, but also can be driven at a low voltage (10V or less), have relatively low power consumption, and exhibits excellent color purity.

Light emitting diodes such as OLEDs or QLEDs are diodes in which, when charges are injected into an emissive layer formed between an electron injection electrode (cathode) and a hole injection electrode (anode), electron-hole pairs are formed and then annihilated, thereby emitting light. Generally, the light-emitting diode includes an anode and a cathode, which are disposed opposite to each other, an emitting material layer (EML) disposed between the anode and the cathode, a hole injection layer (HIL) and a hole transport layer (HTL), which are disposed between the anode and the EML, and an electron transport layer (ETL) disposed between the cathode and the EML. The EML comprises a light-emitting material, and holes and electrons, which are injected from the anode and the cathode, respectively, are combined in the EML, thereby forming excitons. Due to such energy, the light-emitting material included in the EML is in an excited state, in an organic compound, energy transition from the excited state to a ground state occurs, and the energy generated thereby is emitted as light.

Meanwhile, the HIL and the HTL facilitate the injection and transfer of holes, which are positive charge carriers, from the anode to the EML, and the ETL is configured to inject and transport electrons, which are negative charge carriers, from the cathode to the EML. To inject and transport the holes and the electrons into the EML, each layer should be formed of materials having a suitable bandgap energy. As an example, the HIL may be formed of poly(3,4-ethylenedioxythiophene) polystyrene sulfonate (PEDOT:PSS), the HTL may be formed of poly(4-butylphenyl-diphenyl-amine) (Poly-TPD), and ETL may be formed of an organic material such as 2-biphenyl-4-yl-5-(4-t-butylphenyl)-1,3,4-oxadiazole (PBD).

Incidentally, when an organic material is used for a material of the ETL, there is no significant difference in a highest occupied molecular orbital (HOMO) energy level between a light-emitting material used in the EML and an organic material used in the ETL. As described above, due to a relatively high HOMO energy level of the organic compound applied to the ETL, some of the holes injected into the EML are leaked to the ETL. Particularly, in a QLED in which an inorganic light-emitting material having a valence band energy level deeper than the HOMO energy level of the organic material for transporting electrons to the ETL is used for the EML, a large quantity of holes is leaked.

In addition, a lowest unoccupied molecular orbital (LUMO) energy level of the organic material used in the ETL is considerably higher than a conduction band energy level of the cathode. Since a difference between the conduction band energy level of the cathode and the LUMO energy level of the ETL is considerably large, an energy barrier is created between the cathode and the ETL, and thus the injection of electrons produced in the cathode into the ETL is delayed.

As described above, in the related art OLED, as some of the holes injected into the EML do not form excitons but are leaked to the ETL, holes that do not contribute to luminescence increase. In addition, as the injection of the electrons produced in the cathode into the ETL and the EML is delayed, the electrons are not quickly injected into the EML. Because of the failure of the equilibrium between hole and electron injection into the EML, a luminous efficiency of the light-emitting diode and quantum yield are reduced.

SUMMARY OF THE INVENTION

Accordingly, the present disclosure is directed to a light-emitting diode, a process for forming a light emitting diode and a light-emitting device that obviate one or more of the problems due to limitations and disadvantages of the related art.

Embodiment of the present disclosure are to provide a light-emitting diode having improved charge mobility by reducing charge trap sites while driving, a method of forming a charge transfer layer constituting the light-emitting diode, and a light-emitting device having the light-emitting diode.

The present disclosure further provides a light-emitting diode having improved luminescence properties, a method of forming a charge transfer layer constituting the light-emitting diode, and a light-emitting device having the light-emitting diode.

According to an aspect of the present disclosure, the present disclosure provides a light-emitting diode, which includes an electron transfer layer between electrodes that are disposed opposite to each other, wherein the electron transfer layer comprises anisotropic nanorods, and the long axis of the anisotropic nanorod is arranged at an angle of about 20 to about 90° (degrees) with respect to the interface between the electron transfer layer and a layer adjacent to the electron transfer layer.

According to another aspect of the present disclosure, the present disclosure provides a method of forming an electron transfer layer of the light-emitting diode, the method including: coating a substrate prepared previously with a dispersion containing anisotropic nanorods in a solvent, and stacking an electron transfer layer including the anisotropic nanorods on the substrate by baking the solution applied to the substrate, wherein the stacking of the electron transfer layer is performed by pre-baking the substrate at a temperature of about 5 to about 50° C. lower than a boiling point of the solvent for about 5 to about 30 minutes and post-baking the substrate at a temperature ranging from the boiling point of the solvent to a temperature of about 20° C. higher than the boiling point of the solvent for about 20 to about 30 minutes.

According to still another aspect of the present disclosure, the present disclosure provides a light-emitting device, for example, a light-emitting display device, which has the above-described light-emitting diode.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

In FIGS. 6 to 9, samples represented by only ZnO mean that isotropic nanodot-shaped ZnO is used;

DETAILED DESCRIPTION OF THE EMBODIMENTS

Hereinafter, the present disclosure will be described with reference to accompanying drawings when needed.

Figure 1:
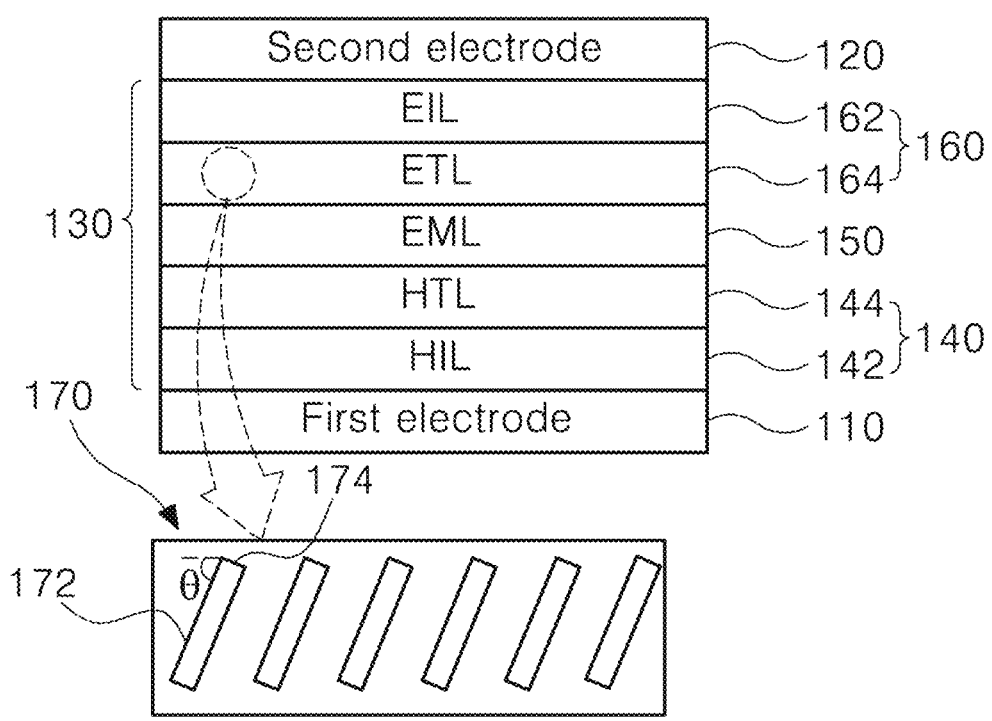
FIG. 1 is a cross-sectional view schematically illustrating a structure of a light-emitting diode according to a first exemplary embodiment of the present disclosure, in which anisotropic nanorods are applied to an electron transfer layer.

FIG. 1 is a cross-sectional view schematically illustrating a light-emitting diode having a normal structure according to a first exemplary embodiment of the present disclosure. As illustrated in FIG. 1, the light-emitting diode 100 according to the first exemplary embodiment of the present disclosure includes a first electrode 110, a second electrode 120 disposed opposite to the first electrode 110, and an emissive layer 130 disposed between the first electrode 110 and the second electrode 120 and including an EML 150. As an example, the emissive layer 130 may further include a first charge transfer layer 140 between the first electrode 110 and the EML 150, and a second charge transfer layer 160 between the EML 150 and the second electrode 120.

According to the first exemplary embodiment of the present disclosure, the first electrode 110 may be an anode such as a hole injection electrode. The first electrode 110 may be formed on a substrate which is formed of glass or a polymer. As an example, the first electrode 110 may be a doped or undoped metal oxide such as indium-tin-oxide (ITO), indium-zinc-oxide (IZO), indium-tin-zinc-oxide (ITZO), indium-copper-oxide (ICO), tin oxide ($SnO_2$), indium oxide ($In_2O_3$), cadmium:zinc oxide (Cd:ZnO), fluorine:tin oxide (F:$SnO_2$), indium:zinc oxide (In:$SnO_2$), gallium:tin oxide (Ga:$SnO_2$) or aluminum:zinc oxide (Al:ZnO; AZO). Optionally, the first electrode 110 may comprise a metal or non-metal material, other than the above-described metal oxide, for instance, nickel (Ni), platinum (Pt), gold (Au), silver (Ag), iridium (Ir) or a carbon nanotube (CNT).

In the first exemplary embodiment of the present disclosure, the second electrode 120 may be a cathode such as an electron injection electrode. As an example, the second electrode 120 may comprise Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 110 and the second electrode 120 may be stacked to a thickness of 30 to 300 nm.

In one exemplary embodiment, for a bottom emission-type light-emitting diode, the first electrode 110 may comprise a transparent conductive metal such as ITO, IZO, ITZO or AZO, and as the second electrode 120, Ca, Ba, Ca/Al, LiF/Ca, LiF/Al, $BaF_2$/Al, Al, Mg, or an Ag:Mg alloy may be used.

The first charge transfer layer 140 that can constitute the emissive layer 130 is disposed between the first electrode 110 and the EML 150. In the first exemplary embodiment of the present disclosure, the first charge transfer layer 140 may be a hole transfer layer which provides holes to the EML 150. As an example, the first charge transfer layer 140 includes a HIL 142 disposed adjacent to the first electrode 110 between the first electrode 110 and the EML 150, and an HTL 144 disposed adjacent to the EML 150 between the first electrode 110 and the EML 150.

The HIL 142 facilitates the injection of holes, from the first electrode 110, into the EML 150. As an example, the HIL 142 may comprise an organic material selected from the group consisting of poly(ethylenedioxythiophene):polystyrenesulfonate (PEDOT:PSS); tetrafluoro-tetracyano-quinodimethane (F4-TCNQ)-doped 4,4',4"-tris(diphenylamino)triphenylamine (TDATA), for example, a p-doped phthalocyanine such as F4-TCNQ-doped zinc phthalocyanine (ZnPc), F4-TCNQ-doped N,N'-diphenyl-N,N'-bis(1-naphthyl)-1,1'-biphenyl-4,4"-diamine (α-NPD); hexaazatriphenylene-hexanitrile (HAT-CN); and a combination thereof, but the present disclosure is not limited thereto. As an example, the dopant such as F4-TCNQ may be doped at a ratio of 1 to 30 wt % with respect to the weight of a host. The HIL 142 may be omitted according to the structure and type of the light-emitting diode 100.

The HTL 144 transfers holes from the first electrode 110 to the EML 150. The HTL 144 may comprise an inorganic material or an organic material. As an example, when the HTL 144 comprises an organic material, the HTL 144 may be formed of an organic material selected from the group consisting of arylamines such as 4,4'-N,N'-dicarbazolyl-biphenyl (CBP), N,N'-diphenyl-N,N'-bis(1-naphtyl)-1,1'-biphenyl-4,4"-diamine (α-NPD), N,N'-diphenyl-N,N'-bis(3-methylphenyl)-(1,1'-biphenyl)-4,4'-diamine (TPD), N,N'-bis (3-methylphenyl)-N,N'-bis(phenyl)-spiro (spiro-TPD), N,N'-di(4-(N,N'-diphenyl-amino)phenyl)-N,N'-diphenyl-benzidine (DNTPD), 4,4',4"-tris(N-carbazolyl)-triphenylamine (TCTA), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), and poly(4-butylphenyl-diphenyl amine) (poly-TPD); polyaniline; a polypyrrole; poly(para)phenylene vinylenes or derivatives thereof such as poly(phenylene vinylene) (PPV), poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); copper phthalocyanine; aromatic tertiary amines or polynuclear aromatic tertiary amines; a 4,4'-bis(p-carbazolyl)-1,1'-biphenyl compound; N,N,N',N'-tetraarylbenzidine; PEDOT:PSS and derivatives thereof; poly(N-vinylcarbazole) (PVK) and derivatives thereof; a polymethacrylate and derivatives thereof; poly(9,9-octylfluorene) and derivatives thereof; poly(spiro-fluorene) and derivatives thereof; N,N'-di(naphthalene-1-yl)-N,N'-diphenyl-benzidine (NPB); spiro-NPB; and a combination thereof.

When the HTL 144 comprises an inorganic material, the HTL 144 may be formed of an inorganic material selected from the group consisting of a metal oxide such as NiO, $MoO_3$, $Cr_2O_3$, $Bi_2O_3$ or p-type ZnO; a non-oxide equivalent such as copper thiocyanate (CuSCN), $Mo_2S$, or p-type GaN; and a combination thereof.

In the drawing, although the first charge transfer layer 140 is divided into the HIL 142 and the HTL 144, the first charge transfer layer 140 may be formed as a monolayer. For example, the HIL 142 may be omitted, the first charge transfer layer 140 may comprise only the HTL 144, or the above-described hole transport organic material may be doped with the hole injection material (e.g., PEDOT:PSS).

The first charge transfer layer 140 including the HIL 142 and the HTL 144 may be formed by one selected from a vacuum deposition process including vacuum vapor deposition and sputtering, and a solution process such as spin coating, drop coating, dip coating, spray coating, roll coating, flow coating, and casting, screen printing and inkjet printing, or a combination thereof. For example, thicknesses of the HIL 142 and the HTL 144 may range from 10 to 200 nm, and preferably 10 to 100 nm, but the present disclosure is not limited thereto.

The EML 150 may consist of inorganic luminescent particles or an organic light-emitting material. When the EML 150 comprises inorganic luminescent particles, the inorganic luminescent particles may comprise inorganic light-emitting nanoparticles such as quantum dots (QDs) or quantum rods (QRs).

QDs or QRs are inorganic particles that emit light while electrons in an unstable state drop from a conduction band to a valence band. These inorganic light-emitting nanoparticles have a very high extinction coefficient and excellent quantum yield among inorganic particles, and thus generate strong fluorescence. In addition, since an emission wavelength varies according to the size of inorganic light-emitting nanoparticles, when the size of inorganic light-emitting nanoparticles is adjusted, light in the entire visible light region may be obtained, thereby realizing a variety of colors. That is, when the inorganic light-emitting nanoparticles such as the QDs or QRs are used as a light-emitting material of the EML 150, the color purity of each pixel may be increased, and white light consisting of red (R), green (G) and blue (B) light with high purity may be realized.

In one exemplary embodiment, each of the QDs or QRs may have a single structure. In another exemplary embodiment, the QDs or QRs may have a heterologous core/shell structure. Here, the shell may comprise one shell, or multi-shells.

According to reaction temperature of synthesizing the core and/or shell, a ligand typ, and reactivity and the injection rates of reaction precursors constituting the core and/or the shell, a growth degree, a crystal structure and the like of these inorganic light-emitting nanoparticles may be adjusted, and therefore, light emission in various wavelengths according to the adjustment of an energy bandgap may be induced.

As an example, each of the QDs or QRs may have a heterologous structure, which comprises a core component disposed in the center of the QD or QR for emitting light, and a shell surrounding the surface of the core to protect the core, and ligand components may surround the surface of the shell to disperse the QDs or QRs in a solvent. For example, each of the QDs or QRs may have a type-I core/shell structure in which the energy bandgap of the component of the core is surrounded by the energy bandgap of the shell, and electrons and holes are transferred to the core and recombined in the core, which is a luminous body, thereby emitting energy as light.

When the QDs or QRs have a type-I core/shell structure, the core is a part in which luminescence substantially occurs, and the emission wavelength of the QDs or QRs is determined according to a core size. To take advantage of a quantum confinement effect, it is preferred that the core has a smaller size than the exciton Bohr radius according to a material and an optical bandgap at the corresponding size.

Meanwhile, the shell constituting the QDs or QRs promotes the quantum confinement effect of the core and determines the stability of the QDs or QRs. Atoms exposed at the surface of single-structured colloidal QDs or QRs, unlike internal atoms, have lone pair electrons which do not participate in a chemical bond. The energy level of these surface atoms is between the conduction band edge and the valence band edge of the QDs or QRs to trap the charges, thereby forming surface defects. Due to a non-radiative recombination process of excitons, caused by the surface defects, the luminous efficiency of the QDs or QRs may be reduced, and the chemical composition of the QDs or QRs may be modified by the reaction between the trapped charges and external oxygen and compound, or electrical/optical properties of the QDs or QRs may be permanently lost.

Therefore, in one exemplary embodiment, the QDs or QRs may have the heterologous structure of a core/a shell. To effectively form the shell on the surface of the core, the lattice constant of a material constituting the shell should be similar to that of a material constituting the core. As the surface of the core is surrounded by the shell, the oxidation of the core may be prevented, thereby enhancing the chemical stability of the QDs or QRs, minimizing the loss of excitons caused by the surface trap on the surface of the core, preventing the loss of energy by molecular vibration, and thus enhancing quantum yield.

The QDs or QRs may be semiconductor nanocrystals or metal oxide particles having a quantum confinement effect. For example, the QDs or QRs may include Group II-VI, III-V, IV-VI, or nano semiconductor compounds. More specifically, the core and/or shell constituting the QDs or QRs may be Group II-VI compound semiconductor nanocrystals such as CdS, CdSe, CdTe, ZnS, ZnSe, ZnTe, HgS, HgTe and/or a combination thereof; Group III-V compound semiconductor nanocrystals such as GaP, GaAs, GaSb, InP, InAs, InSb and/or a combination thereof; Group IV-VI compound semiconductor nanocrystals such as PbS, PbSe, PbTe and/or a combination thereof; Group compound semiconductor nanocrystals such as $AgGaS_2$, $AgGaSe_2$, $AgGaTe_2$, $CuInS_2$, $CuInSe_2$, $CuGaS_2$, $CuGaSe_2$ and/or a combination thereof; metal oxide nanoparticles such as $ZnO$, $TiO_2$ and/or a combination thereof; or core-shell structured nanocrystals such as CdSe/ZnSe, CdSe/ZnS, CdS/ZnSe, CdS/ZnS, ZnSe/ZnS, InP/ZnS, ZnO/MgO and/or an arbitrary combination thereof. The semiconductor nanoparticle may be undoped or doped with a rare earth element such as Eu, Er, Tb, Tm or Dy or an arbitrary combination thereof, or doped with a transition metal element such as Mn, Cu, Ag or Al or an arbitrary combination thereof.

For example, the core constituting the QDs or QRs may be selected from the group consisting of ZnSe, ZnTe, CdSe, CdTe, InP, ZnCdS, $Cu_xIn_{1-x}S$, $Cu_xIn_{1-x}Se$, $Ag_xIn_{1-x}S$ and a combination thereof. In addition, the shell constituting the QDs or QRs may be selected from the group consisting of ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $Cd_xZn_{1-x}S$ and a combination thereof. Meanwhile, the QDs may be alloy QDs (e.g., $CdS_xSe_{1-x}$, $CdSe_xTe_{1-x}$, and $Zn_x$-$Cd_{1-x}Se$) such as homogeneous alloy QDs or gradient alloy QDs.

When the EML 150 comprises inorganic luminescent particles such as QDs or QRs, the EML 150 is formed by applying a solution containing the QDs or QRs in a solvent on the first charge transfer layer 140, for example, an HTL 144, using a solution process, and volatilizing the solvent.

In one exemplary embodiment, the EML 150 may be formed by applying a dispersion containing the QDs or QRs in a solvent on the first charge transfer layer 140 through a solution process, and volatilizing the solvent. The EML 150 may be formed using one selected from the solution processes such as spin coating, drop coating, dip coating, spray coating, roll coating, flow coating casting, screen printing and inkjet printing, or a combination thereof.

In one exemplary embodiment, the EML 150 may include inorganic light-emitting nanoparticles, QDs or QRs, having photoluminescence (PL) properties at 440 nm, 530 nm, and 620 nm, thereby manufacturing a white light-emitting diode. Optionally, the EML 150 may include luminescent particles such as QDs or QRs having any one of red, green and blue colors, and may be formed to individually emit any one color.

In another optional exemplary embodiment, the EML 150 may comprise an organic light-emitting material. When the EML 150 comprise an organic light-emitting material, any conventional organic light-emitting material is used without particular limitation. For example, the EML 150 may comprise an organic light-emitting material(s) emitting red, green and/or blue light, and may include a fluorescent light-emitting material or a phosphorescent light-emitting material. In addition, the organic light-emitting material constituting the EML 150 may include a host and a dopant. When the organic light-emitting material formed of a host-dopant system, the dopant may be doped at about 1 to about 50 wt %, and preferably about 1 to about 30 wt %, with respect to the host weight, but the present disclosure is not limited thereto.

The organic host used in the EML 150 may be any material which is conventionally used, but the present disclosure is not particularly limited thereto. As an example, the organic host used in the EML 150 may comprise tris(8-hydroxyquinoline)aluminum ($Alq_3$), TCTA, PVK, 4,4'-bis(N-carbazolyl)-1,1'-biphenyl (CBP), 4,4'-bis(9-carbazolyl)-2,2'-dimethylbiphenyl (CDBP), 9,10-di(naphthalene-2-yl) anthracene (ADN), 3-tert-butyl-9,10-di(naphtha-2-yl) anthracene (TBADN), 2-methyl-9,10-bis(naphthalene-2-yl) anthracene (MADN), 1,3,5-tris(N-phenylbenzimidazole-2-yl)benzene (TPBi), distyrylarylene (DSA), mCP, 1,3,5-tris (carbazol-9-yl)benzene (TCP), or the like.

When the EML 150 emits red light, the dopant included in the EML 150 may be an organic compound or organic metal complex such as 5,6,11,12-tetraphenylnaphthalene (rubrene), bis(2-benzo[b]-thiophene-2-yl-pyridine)(acetylacetonate)iridium (III) ($Ir(btp)_2(acac)$), bis[1-(9,9-diemthyl-9H-fluoren-2-yl)-isoquinoline](acetylacetonate) iridium (III) ($Ir(fliq)_2(acac)$), bis[2-(9,9-diemthyl-9H-fluoren-2-yl)-quinoline](acetylacetonate)iridium (III) (Ir$(flq)_2(acac)$), bis-(2-phenylquinoline)(2-(3-methylphenyl) pyridinate)iridium (III) ($Ir(mphq)_2tpy$) or iridium (III)bis(2-(2,4-difluorophenyl)quinoline)picolinate (FPQlrpic), but the present disclosure is not limited thereto.

When the EML 150 emits green light, the dopant included in the EML 150 may be, but is not limited to, an organic compound or organic metal complex such as N,N'-dimethyl-quinacridone (DMQA), coumarin 6, 9,10-bis[N,N-di-(p-tolyl)-amino]anthracene (TTPA), 9,10-bis[phenyl(m-tolyl)-amino]anthracene (TPA), bis(2-phenylpyridine) (acetylacetonate)iridium (III) ($Ir(ppy)_2(acac)$), fac-tris (phenylpyridine)iridium (III) (fac-$Ir(ppy)_3$), or tris[2-(p-tolyl)pyridine]iridium (III) ($Ir(mppy)_3$).

When the EML 150 emits blue light, the dopant included in the EML 150 may be, but is not limited to, an organic compound or organic metal complex such as 4,4'-bis[4-(di-p-tolylamino)styryl]biphenyl (DPAVBi), perylene, 2,5,8,11-tetra-tert-butylpherylene (TBPe), bis(3,5-difluoro-2-(2-pyridyl)phenyl-(2-carbozylpyridyl)iridium (III) (FirPic), mer-tris(1-phenyl-3-methylimidazolin-2ylidene-C,C2') iridium (III) (mer-$Ir(pmi)_3$), or tris(2-(4,6-difluorophenyl) pyridine)iridium (III) ($Ir(Fppy)_3$).

When the EML 150 comprises an organic light-emitting material, the EML 150 may be formed by one selected from vacuum deposition processes including vacuum vapor deposition and sputtering, and solution processes including spin coating, drop coating, dip coating, spray coating, roll coating, and flow coating, cast, screen printing, and inkjet printing, or a combination thereof.

Meanwhile, the second charge transfer layer 160 is disposed between the EML 150 and the second electrode 120. In this exemplary embodiment, the second charge transfer layer 160 may be an electron transfer layer which provides electrons to the EML 150. In one exemplary embodiment, the second charge transfer layer 160 may include an electron injection layer (EIL) 162 disposed adjacent to the second electrode 120 between the second electrode 120 and the EML 150, and an ETL 164 disposed adjacent to the EML 150 between the second electrode 120 and the EML 150.

The EIL 162 facilitates injection of electrons from the second electrode 120 into the EML 150. For example, the EIL 162 may comprise a material in which a metal such as Al, Cd, Cs, Cu, Ga, Ge, In or Li is doped or bound with fluorine, or a metal oxide (e.g., titanium dioxide ($TiO_2$), zinc oxide (ZnO), zirconium oxide (ZrO), tin oxide ($SnO_2$), tungsten oxide ($WO_3$) or tantalum oxide ($Ta_2O_3$)) which is undoped or doped with Al, Mg, In, Li, Ga, Cd, Cs, Cu or the like.

The ETL 164 is configured to transport electrons to the EML 150. The ETL 164 may comprise inorganic particles such as anisotropic nanorods 170. The inorganic particles have a deeper valence band (VB) energy level than a HOMO or valence band (VB) energy level of the light-emitting material used in the EML 150. Therefore, holes injected into the EML 150 from the first electrode 110 are blocked in the ETL 164 consisting of an inorganic material having a very deep VB energy level, and thus, hole leakage to the second electrode 120 may be blocked. In addition, a conduction band (CB) energy level of the ETL 164 comprising an inorganic material is similar to that of the second electrode 120. Since there is no energy barrier between the second electrode 120 and the ETL 164, electrons generated in the second electrode 120 may be rapidly injected into the EML 150 via the ETL 164 comprising an inorganic material.

Generally, the average diameter of the nanodots is merely several nanometers, but the ETL 164 is generally stacked to a thickness of tens of nanometers. Here, as shown in the upper part of FIG. 2, there are many contact points at an interface between isotropic nanodot particles, the contact points at the particle-particle interface serve as trap sites of charges such as electrons. When the ETL 164 is formed of isotropic nanodots, there is a very high probability of trapping electrons at many contact points between the isotropic nanodots. Therefore, when an isotropic nanodot-type inorganic material is used for the ETL 164, electron injection may be delayed.

Figure 2:
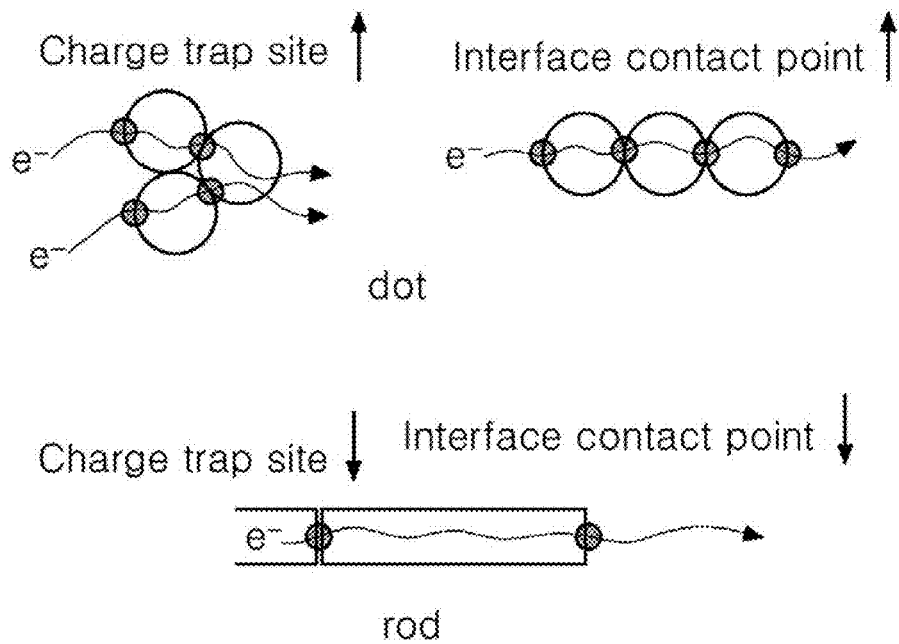
FIG. 2 is a schematic diagram illustrating that, compared with the use of isotropic nanodot-shaped inorganic particles as a material constituting an electron transfer layer, the use of anisotropic nanorod-type inorganic particles according to the present disclosure contributes to reduced electron trap sites, leading to an enhanced electron transfer distance and improved electron mobility.

On the other hand, as shown in the lower part of FIG. 2, when anisotropic nanorods are used, the interface between particles is smaller than that of the nanodots at the same volume, and thus contact points between the particles are reduced. That is, when anisotropic nanorod-type inorganic particles are used for the ETL 164, compared with the use of the isotropic nanodot-type inorganic particles, the contact points between the particles are reduced. For this reason, charge trap sites are also reduced, and thus an electron injection velocity (electron mobility) and an electron drift distance may increase. Accordingly, when the anisotropic nanorod-type inorganic particles are used for the ETL 164, electron injection efficiency may be improved, resulting in improvement in luminous efficiency.

As a result, as illustrated in FIG. 1, the anisotropic nanorod 170 that can be used for the ETL 164 has a long axis 172 and a short axis 174. As an example, the aspect ratio (AR) of the long axis 172 to the short axis 174 of the anisotropic nanorod 170 may range from about 2:1 to about 4:1. When the aspect ratio of the long axis 172 to the short axis 174 of the anisotropic nanorod 170 ranges from about 2:1 to about 4:1, the electron trap sites are reduced and thus electron mobility is improved, and as a result, a light-emitting diode 100 having improved luminescence properties such as current density or luminescence may be realized.

In addition, anisotropic nanorod 170-type metal oxide particles may be prepared by hydrothermal synthesis or vapor phase growth. As an example, in the anisotropic nanorods 170, the length of the long axis 172 may range from approximately 4 to 40 run, and the length of the short length 174 may range from 2 to 10 nm, but the present disclosure is not limited thereto.

In particular, the long axis 172 of the anisotropic nanorod 170 constituting the ETL 164 according to the present disclosure may be arranged at a predetermined angle (0) with respect to an interface with an adjacent layer into which electrons are injected or from which electrons are emitted (e.g., the second electrode 120 or the EIL 162 in a second exemplary embodiment of the present disclosure). When the long axis 172 of the anisotropic nanorod 170 is arranged as perpendicular as possible to the interface with the electron-injected adjacent layer, trap sites of the anisotropic nanorods 170 for the electrons injected into the ETL 164 are reduced, electron mobility is improved, and an electron drift distance is also increased. Therefore, in the ETL 164, the velocity and efficiency of injecting electrons to the EML 150 may be improved, and thus the luminescence properties of the light-emitting diode 100 may be improved.

As an example, the long axes 172 of the anisotropic nanorods 170 may be arranged at an angle ranging from about 20 to about 90 degrees, preferably 30 to 90 degrees, and more preferably 50 to 90 degrees with respect to the electron-injected interface. It is preferable to control baking conditions in a solution process in order to arrange the long axes 172 of the anisotropic nanorods 170 as perpendicular as possible to the electron-injected interface, and the control of baking conditions will be described below.

In one exemplary embodiment, to prepare the anisotropic nanorod 170-type inorganic particles, a metal oxide that has excellent electron mobility, allows holes and electrons to be injected into the EML 150 in equilibrium, and has excellent efficiency of the recombination of injected charges may be used. For example, the inorganic material for the anisotropic nanorod 170 may be a metal oxide selected from, but are not limited to, the group consisting of zinc oxide (ZnO), zinc magnesium oxide (ZnMgO), titanium dioxide ($TiO_2$), magnesium oxide (MgO), zirconium dioxide ($ZrO_2$), tin oxide (SnO), tin dioxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), and barium zirconium oxide ($BaZrO_3$) and combination thereof. When needed, the anisotropic nanorod 170-type metal oxide particles may be undoped, or doped with Al, Mg, In, Li, Ga, Cd, Cs, Cu or the like.

Similar to the first charge transfer layer 140, although FIG. 1 illustrates that the second charge transfer layer 160 as a bilayer of the EIL 162 and the ETL 164, the second charge transfer layer 160 may be formed as a monolayer of the ETL 164. In addition, the second charge transfer layer 160 may be formed as a single layer of the ETL 164 formed of a blend of cesium carbonate with the above-described electron-transporting inorganic material.

The second charge transfer layer 160 including the EIL 162 and/or the ETL 164 may be formed using one selected from solution processes such as spin coating, drop coating, dip coating, spray coating, roll coating, flow coating, casting, screen printing and inkjet printing, or a combination thereof. As an example, each of the EIL 162 and the ETL 164 may be stacked to a thickness of 10 to 200 nm, and preferably 10 to 100 nm.

For example, when a hybrid charge transfer layer (CTL), in which the HTL 144 constituting the first charge transfer layer 140 comprises an organic material and the second charge transfer layer 160 comprises an inorganic material, or the HTL 144 comprises an inorganic material and the second charge transfer layer 160 comprises an organic material, is introduced, the luminescence properties of the light-emitting diode 100 may be enhanced.

Meanwhile, when holes are transferred to the second electrode 120 through the EML 150 or electrons are transported to the first electrode 110 through the EML 150, the lifespan and efficiency of the diode may be reduced. To prevent such reduction, the light-emitting diode 100 according to the first exemplary embodiment of the present disclosure may include at least one exciton blocking layer adjacent to the EML 150.

For example, the light-emitting diode 100 according to the first exemplary embodiment of the present disclosure may have an electron blocking layer (EBL) capable of controlling and preventing the transfer of electrons between the HTL 144 and the EML 150.

As an example, the EBL may comprise TCTA, tris[4-(diethylamino)phenyl]amine), N-(biphenyl-4-yl)-9,9-dimethyl-N-(4-(9-phenyl-9H-carbazole-3-yl)phenyl)-9H-fluoren-2-amine, tri-p-tolylamine, 1,1-bis(4-(N,N-di(p-tolyl)amino)phenyl)cyclohexane (TAPC), m-MTDATA, 1,3-bis(N-carbazolyl)benzene (mCP), 3,3'-bis(N-carbazolyl)-1,1'-biphenyl (mCBP), poly-TPD, copper phthalocyanine (CuPc), DNTPD and/or 1,3,5-tris[4-(diphenylamino)phenyl]benzene (TDAPB).

In addition, a hole blocking layer (HBL), as a second exciton blocking layer, may be disposed between the EML 150 and the ETL 164, thereby preventing the transfer of holes between the EML 150 and the ETL 164. In one exemplary embodiment, as a material for the HBL, a derivative of an oxadiazole-based compound, a triazole-based compound, a phenanthroline-based compound, a benzoxazole-based compound, a benzothiazole-based compound, a benzimidazole-based compound, a triazine-based compound or the like may be used.

For example, the HBL may comprise 2,9-dimethyl-4,7-diphenyl-1,10-phenanthroline (BCP), BAlq, $Alq_3$, PBD, spiro-PBD and/or 8-hydroxy-quinolinato lithium (LIQ), which have/has a deeper highest occupied molecular orbital (HOMO) energy level than that of the material used for the EML 150.

As described above, in the first exemplary embodiment of the present disclosure, the ETL 164 disposed between the EML 150 and the second electrode 120 is formed of anisotropic nanorod 170-type inorganic particles. Particularly, the long axes of the anisotropic nanorods 170 are arranged as perpendicular as possible to the electron-injected interface. As trap sites of electrons injected into the ETL 164 are reduced, electron mobility is improved, an electron drift distance increases, the efficiency and velocity of electron injection into the EML 150 are enhanced, and thus the luminescence properties of the light-emitting diode 100 may be improved.

Figure 3:
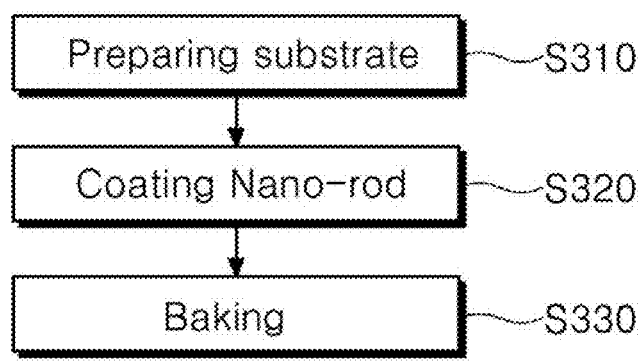
FIG. 3 is a flowchart schematically illustrating a process of forming an electron transfer layer according to an exemplary embodiment of the present disclosure, to which anisotropic nanorod-type inorganic particles whose long axes are arranged at a predetermined angle with respect to the interface with an adjacent emissive layer, which constitutes a light-emitting diode, are applied.

To continue, a process of forming the electron transfer layer 160 using the anisotropic nanorods 170 having the long axis 172 arranged as perpendicular as possible to the electron-injected interface is described with reference to FIG. 3. As illustrated in FIG. 3, the method of forming the ETL 160 constituting the light-emitting diode according to the present disclosure includes preparing a substrate (S310), coating the substrate with a dispersion containing the anisotropic nanorods 170 (see FIG. 1) (S320) and baking the anisotropic nanorod-containing dispersion applied onto the substrate (S330).

In the light-emitting diode according to the exemplary embodiment illustrated in FIG. 1, the substrate onto which the dispersion containing the anisotropic nanorods 170 (see FIG. 1) is applied may be the EML 150 (see FIG. 1). On the other hand, in a light-emitting diode having an inverted structure illustrated in FIG. 4, a substrate onto which a dispersion containing anisotropic nanorods 170 is applied may be a first electrode 210 (see FIG. 4) or an EIL 242 (see FIG. 4).

A solvent that can disperse the anisotropic nanorods 170 is not particularly limited. Here, a solvent that disperses the anisotropic nanorods 170 may be an orthogonal solvent that does not disperse a light-emitting material constituting the EML 150 adjacent to the ETL 164. When a solvent dispersing both of the anisotropic nanorods 170 constituting the ETL 164 and a light-emitting material constituting the EML 150 is used, an emitting material may be blended with a solution for forming the ETL 164, and thus the boundary between the EML 150 and the ETL 164 may not be clearly distinguished. As a result, the luminescence properties of the light-emitting diode 100 may be degraded.

As an example, when the anisotropic nanorods 170 are metal oxide particles, a solvent capable of dispersing the anisotropic nanorods 170 may be a $C_1$ to $C_5$ alcohol, ethylene glycol, propylene glycol, dimethyl sulfoxide and a combination thereof. In one exemplary embodiment, a $C_1$ to $C_5$ alcohol such as methanol, ethanol, isopropyl alcohol and/or butanol, which have (has) an excellent dispersion property with respect to anisotropic metal oxide particles, may be used as a dispersion solvent.

In the applying of the dispersion containing the anisotropic nanorods 170 in such a solvent onto the substrate (S320), the application method may be, but is not particularly limited to, one selected from the solution processes such as spin coating, drop coating, dip coating, spray coating, roll coating, flow coating casting, screen printing and inkjet printing, or a combination thereof. As an example, when spin coating is applied, the dispersion containing the anisotropic nanorods 170 in a solvent may be applied onto the substrate by performing spin coating at 1000 to 5000 rpm, and preferably 1500 to 4000 rpm.

When the dispersion containing the anisotropic nanorods 170 is baked at approximately the boiling point of a solvent, the solvent is evaporated in an arbitrary direction, and accordingly, the long axes 172 of the anisotropic nanorods 170 are arranged in a random direction. However, the baking of the solution applied onto the substrate (S330) according to the present disclosure may include pre-baking and post-baking. As an example, the forming of the ETL 164 including the anisotropic nanorods 170 on the substrate may include pre-baking at a temperature of about 5 to about 50° C., and preferably, about 10 to about 50° C. lower than the boiling point of the solvent constituting the solution coated on the substrate for about 5 to about 30 minutes, and post-baking at the boiling point to a temperature of about 20° C. higher than the boiling point of the solvent for about 20 to about 30 minutes.

When the pre-baking is performed at a temperature relatively lower than the boiling point of the solvent, during the pre-baking, the solvent is evaporated in a direction as perpendicular as possible to the solution-applied surface, and according to the solvent evaporated in a direction as perpendicular as possible as described above, the long axes 172 of the anisotropic nanorod 170 may be arranged. As a result, the long axes 172 of the anisotropic nanorods 170 may be arranged as perpendicular as possible to an electron-injected interface, for example, at an angle of about 20 to about 90 degrees, preferably, about 25 to about 90 degrees, more preferably, about 30 to about 90 degrees, and the most preferably, about 50 to about 90 degrees.

In one exemplary embodiment, the pre-baking may include pre-baking the solution coated on the substrate at a temperature of about 30 to about 50° C. lower than the boiling point of the solvent for about 5 to about 20 minutes, and preferably, about 10 to about 20 minutes as a first step, and after the first pre-baking, pre-baking at a temperature of about 10 to about 30° C., and preferably, about 20 to about 30° C. lower than the boiling point of the solvent for about 10 to about 20 minutes as a second step. By performing such two or more steps of pre-baking, the long axes 172 of the anisotropic nanorods 170 may be arranged as perpendicular as possible, for example, at an angle of about 50 to about 90 degrees, with respect to the electron-injected interface.

Meanwhile, the light-emitting diode having a normal structure in which an HTL is disposed between a first electrode having a relatively low work function and an EML, and an electron transfer layer is disposed between a second electrode having a relatively high work function and an EML has been described with reference to FIG. 2. The light-emitting diode may alternatively have an inverted structure, other than the normal structure, and this case will be described with reference to FIG. 4.

Figure 4:
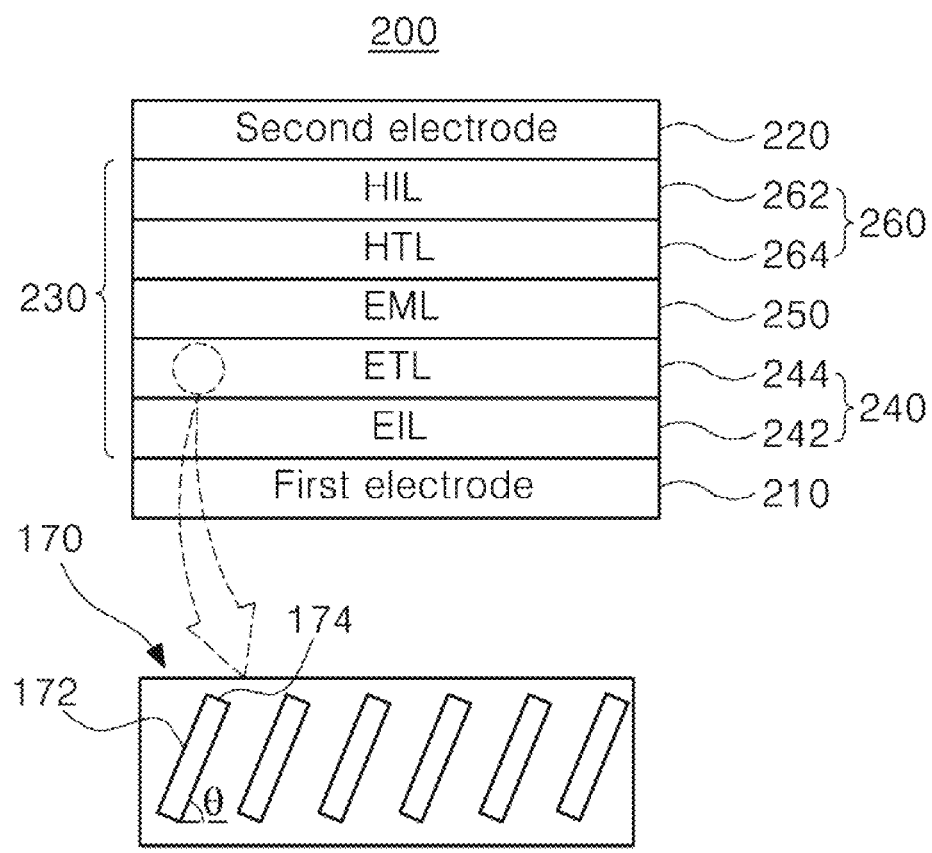
FIG. 4 is a cross-sectional view schematically illustrating a structure of a light-emitting diode according to a second exemplary embodiment of the present disclosure, in which anisotropic nanorods are applied to an electron transfer layer.

FIG. 4 is a cross-sectional view schematically illustrating a light-emitting diode having an inverted structure according to a secondary exemplary embodiment of the present disclosure. As illustrated in FIG. 4, the light-emitting diode 200 according to the second exemplary embodiment of the present disclosure includes a first electrode 210, a second electrode 220 disposed opposite to the first electrode 210, and an emissive layer 230 disposed between the first electrode 210 and the second electrode 220 and including an EML 250. The emissive layer 230 may further include a first charge transfer layer 240 disposed between the first electrode 210 and the EML 250, and a second charge transfer layer 260 disposed between the second electrode 220 and the EML 250.

In the second exemplary embodiment of the present disclosure, the first electrode 210 may be a cathode such as an electron injection electrode. As an example, first electrode 210 may comprise a doped or undoped metal oxide such as ITO, IZO, ITZO, ICO, $SnO_2$, $In_2O_3$, Cd:ZnO, $F:SnO_2$, $In:SnO_2$, $Ga:SnO_2$ and AZO, or of a material containing Ni, Pt, Au, Ag, Ir or a CNT, other than the above-described metal oxides.

In the second exemplary embodiment of the present disclosure, the second electrode 220 may be an anode such as a hole injection electrode. As an example, the second electrode 220 may be Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. For example, each of the first electrode 210 and the second electrode 220 may be stacked to a thickness of 30 nm to 300 nm.

In the second exemplary embodiment of the present disclosure, the first charge transfer layer 240 may be an electron transfer layer that supplies electrons to the EML 250. In one example embodiment, the first charge transfer layer 240 includes an EIL 242 between the first electrode 210 and the EML 250 such that the EIL 242 is located adjacent to the first electrode 210, and an ETL 244 between the first electrode 210 and the EML 250 such that the ETL 244 is located adjacent to the EML 250.

The EIL 242 may be formed of a material obtained by doping a metal such as Al, Cd, Cs, Cu, Ga, Ge, In, or Li with fluorine or binding such a metal to fluorine; or a metal oxide such as $TiO_2$, ZnO, ZrO, $SnO_2$, $WO_3$, or $Ta_2O_3$ that is undoped or doped with Al, Mg, In, Li, Ga, Cd, Cs, Cu, or the like.

The ETL 244 may be formed of anisotropic nanorod 170-type inorganic particles. The inorganic particles may be metal oxide particles having excellent electron mobility. The anisotropic nanorod 170 may have a long axis 172 and a short axis 174, and the aspect ratio of the long axis 172 to the short axis 174 may range from about 2:1 to about 4:1. As an example, the long axes 172 of the anisotropic nanorods 170 may be arranged at an angle (θ) of about 20 to about 90 degrees with respect to an electron-injected interface (e.g., an interface with the first electrode 210 or the EIL 242).

Here, the first charge transfer layer 240 may be formed only as a monolayer of the ETL 244. In addition, the first charge transfer layer 240 may be formed as a monolayer of the ETL 244 formed by blending cesium carbonate with the above-described electron-transporting inorganic material consisting of the above-described anisotropic nanorod 170-type inorganic particles. As an example, each of the EIL 242 and the ETL 244 may be stacked to a thickness of 10 to 200 nm, and preferably 10 to 100 nm.

The EML 250 may be formed of inorganic luminescent particles or an organic light-emitting material. The inorganic luminescent particles may be inorganic light-emitting nanoparticles such as QDs or QRs. The QDs or QRs may have a single structure, or a heterologous core/shell structure.

The QDs or QRs may be semiconductor nanocrystals or metal oxide particles having a quantum confinement effect. For example, the QDs or QRs may include Group II-VI, III-V, IV-VI, or nano semiconductor compounds. More specifically, the core and/or shell constituting the QDs or QRs may be Group II-VI compound semiconductor nanocrystals such as CdS, CdSe, CdTe, ZnS, ZnSe, ZnTe, HgS, HgTe and/or a combination thereof; Group III-V compound semiconductor nanocrystals such as GaP, GaAs, GaSb, InP, InAs, InSb and/or a combination thereof; Group IV-VI compound semiconductor nanocrystals such as PbS, PbSe, PbTe and/or a combination thereof; Group compound semiconductor nanocrystals such as $AgGaS_2$, $AgGaSe_2$, $AgGaTe_2$, $CuInS_2$, $CuInSe_2$, $CuGaS_2$, $CuGaSe_2$ and/or a combination thereof; metal oxide nanoparticles such as ZnO, $TiO_2$ and/or a combination thereof; or core-shell structured nanocrystals such as CdSe/ZnSe, CdSe/ZnS, CdS/ZnSe, CdS/ZnS, ZnSe/ZnS, InP/ZnS, ZnO/MgO and/or an arbitrary combination thereof. The semiconductor nanoparticle may be undoped or doped with a rare earth element such as Eu, Er, Tb, Tm or Dy or an arbitrary combination thereof, or doped with a transition metal element such as Mn, Cu, Ag or Al or an arbitrary combination thereof.

When the EML 250 comprises inorganic luminescent particles such as QDs or QRs, the EML 250 is formed by applying a solution containing the QDs or QRs in a solvent on the first charge transfer layer 240, for example, an HTL 244, using a solution process, and volatilizing the solvent.

When the EML 250 comprises an organic light-emitting material, the EML 250 may be formed of an organic light-emitting material(s) emitting red light, green light and/or blue light, and may further include a fluorescence-emitting material or a phosphorescence-emitting material. In addition, the organic light-emitting material constituting the EML 250 may include a host and a dopant. When the organic light-emitting material formed of a host-dopant system, the dopant may be doped at 1 to 50 wt %, and preferably 1 to 30 wt %, with respect to the host weight, but the present disclosure is not limited thereto.

When the EML 250 comprises an organic light-emitting material, the EML 250 may be formed by one selected from vacuum deposition processes including vacuum vapor deposition and sputtering, and solution processes including spin coating, drop coating, dip coating, spray coating, roll coating, flow coating, cast, screen printing, and inkjet printing, or a combination thereof.

Meanwhile, in the second exemplary embodiment of the present disclosure, the second charge transfer layer 260 may be an hole transfer layer which provides holes to the EML 250. In one exemplary embodiment, the second charge transfer layer 260 may include an HIL 262 disposed adjacent to the second electrode 220 between the second electrode 220 and the EML 250, and an HTL 264 disposed adjacent to the EML 250 between the second electrode 220 and the EML 250.

The HIL 262 may be formed of a material selected from the group consisting of PEDOT:PSS, F4-TCNQ-doped TDATA, for example, a p-doped phthalocyanine such as F4-TCNQ-doped ZnPc, F4-TCNQ-doped α-NPD, HAT-CN and a combination thereof, but the present disclosure is not limited thereto. As an example, a dopant such as F4-TCNQ may be used for doping of a host at a quantity of 1 to 30 wt % with respect to the weight of a host. The HIL 262 may be omitted according to the structure and type of the light-emitting diode 200.

The HTL 264 may comprise an inorganic material or an organic material. As an example, the HTL 264 may comprise an organic material selected from the group consisting of arylamines such as CBP, α-NPD, TPD, spiro-TPD, DNTPD, TCTA, m-MTDATA, TFB and poly-TPD; polyaniline; a polypyrrole; poly(para)phenylenevinylenes such as PPV, MEH-PPV and MOMO-PPV and derivatives thereof copper phthalocyanine; aromatic tertiary amines or polynuclear tertiary amines; 4,4'-bis(p-carbazolyl)-1,1'-biphenyl compounds; N,N,N',N'-tetraarylbenzidine; PEDOT:PSS and derivatives thereof poly-N-vinylcarbazole and derivatives thereof polymethacrylate and derivatives thereof; poly(9,9-octylfluorene) and derivatives thereof poly(spiro-fluorene) and derivatives thereof; NPB; spiro-NPB and a combination thereof.

The HTL 264 may comprise an inorganic material selected from the group consisting of metal oxides such as NiO, $MoO_3$, $Cr_2O_3$, $Bi_2O_3$ and p-type ZnO; non-oxidized equivalents such as copper thiocyanate (CuSCN), $Mo_2S$, and p-type GaN; and a combination thereof.

The second charge transfer layer 260 may be formed as a monolayer. For example, the second charge transfer layer 260 may comprise only the HTL 264 without the HIL 262, or may be prepared by doping the above-described hole-transporting organic material with a hole injection material (e.g., PEDOT:PSS). Thicknesses of the HIL 262 and the HTL 264 may range from 10 to 200 nm, and preferably 10 to 100 nm, but the present disclosure is not limited thereto.

Similar to the first exemplary embodiment, the light-emitting diode 200 according to the second exemplary embodiment of the present disclosure may include at least one exciton blocking layer disposed adjacent to the EML 250. For example, the light-emitting diode 200 may further include an EBL disposed between the EML 250 and the HTL 264 to control and prevent the transfer of electrons, and an HBL disposed between the ETL 244 and the EML 250 to control and prevent the transfer of holes.

As described above, according to the second exemplary embodiment of the present disclosure, the ETL 244 disposed between the first electrode 210 and the EML 250 is formed of an inorganic material such as a metal oxide. Holes generated in the second electrode 220 and then injected into the EML 250 may be blocked in the ETL 244 formed of an inorganic material having a deep VB energy level. The ETL 244 may comprise anisotropic nanorods 170, and long axes 172 of the anisotropic nanorods 170 are arranged as perpendicular as possible with respect to an electron-injected interface. As trap sites of electrons injected into the ETL 244 are reduced, electron mobility is improved, and an electron drift distance increases. Accordingly, the efficiency and velocity of electron injection into the EML 250 are enhanced, and thus the luminescence properties of the light-emitting diode 200 may be improved.

Figure 5:
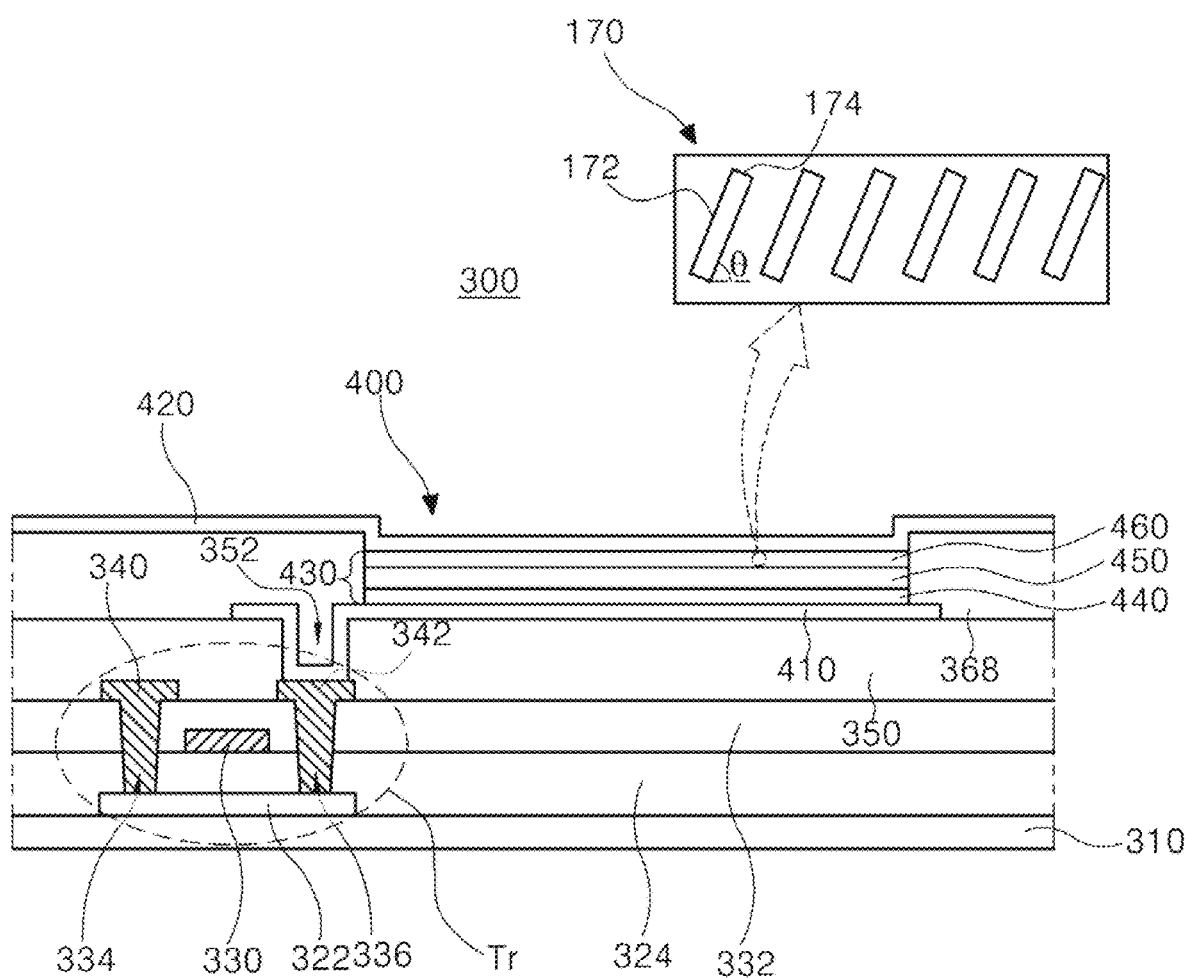
FIG. 5 is a cross-sectional view schematically illustrating a structure of a light-emitting diode display device as an example of a light-emitting device to which the light-emitting diode according to the present disclosure is applied.
Figure 6:
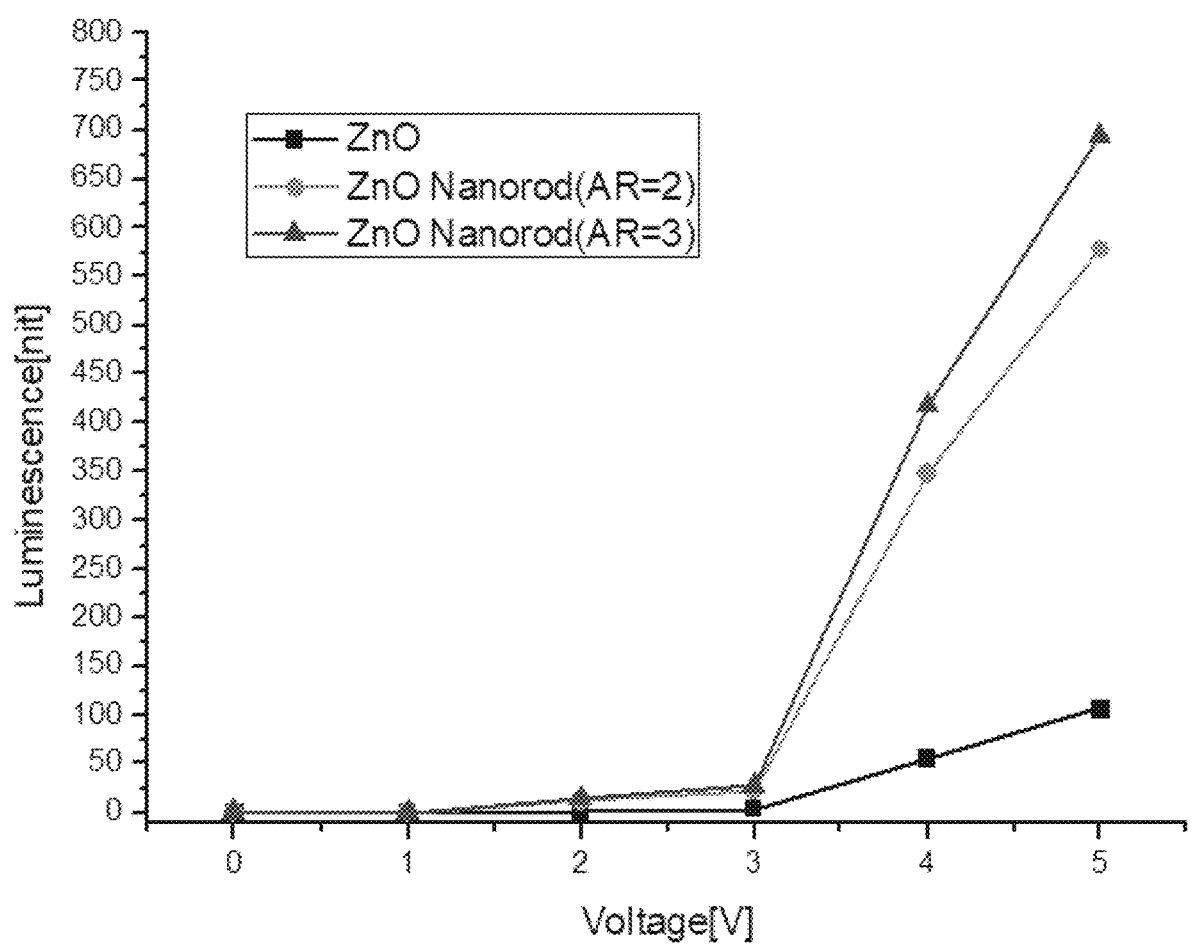
FIGS. 6 to 9 are graphs of voltage (V)-luminescence, voltage-current density, electroluminescence (EL) spectra, and the maximum luminescence for anisotropic nanorod-type inorganic particles having different aspect ratios (AR) in an electron transfer layer according to the present disclosure, respectively.
Figure 7:
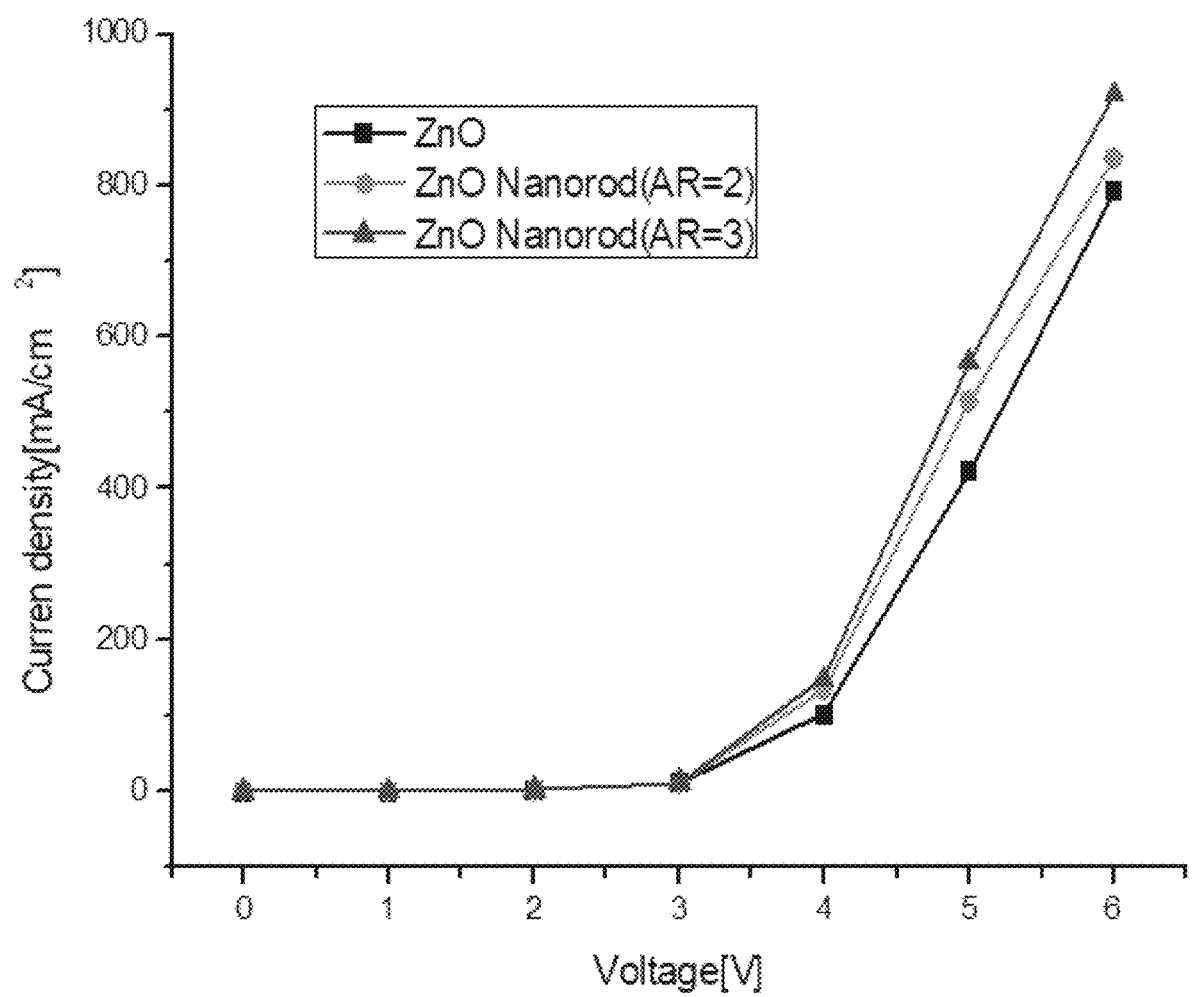
Figure 8:
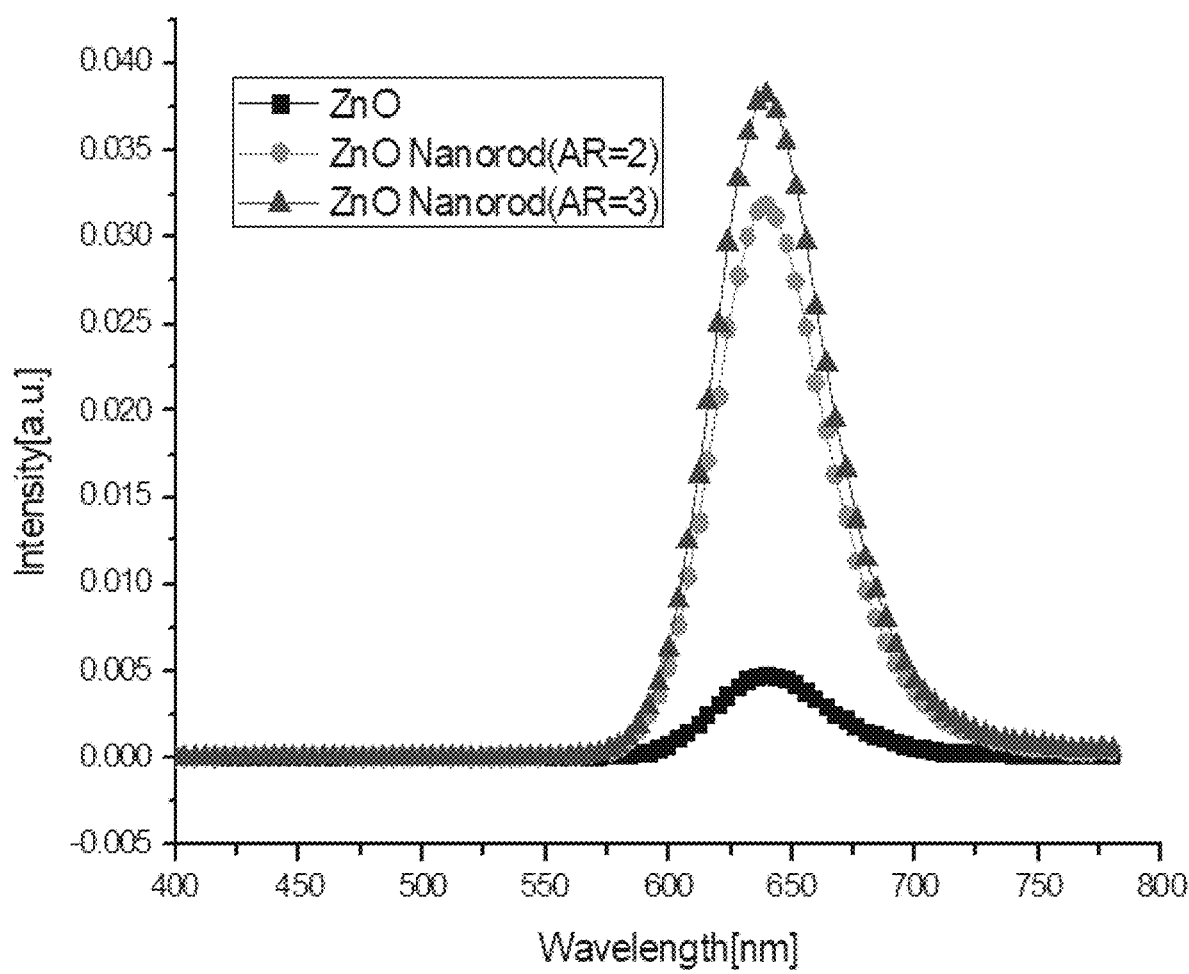
Figure 9:
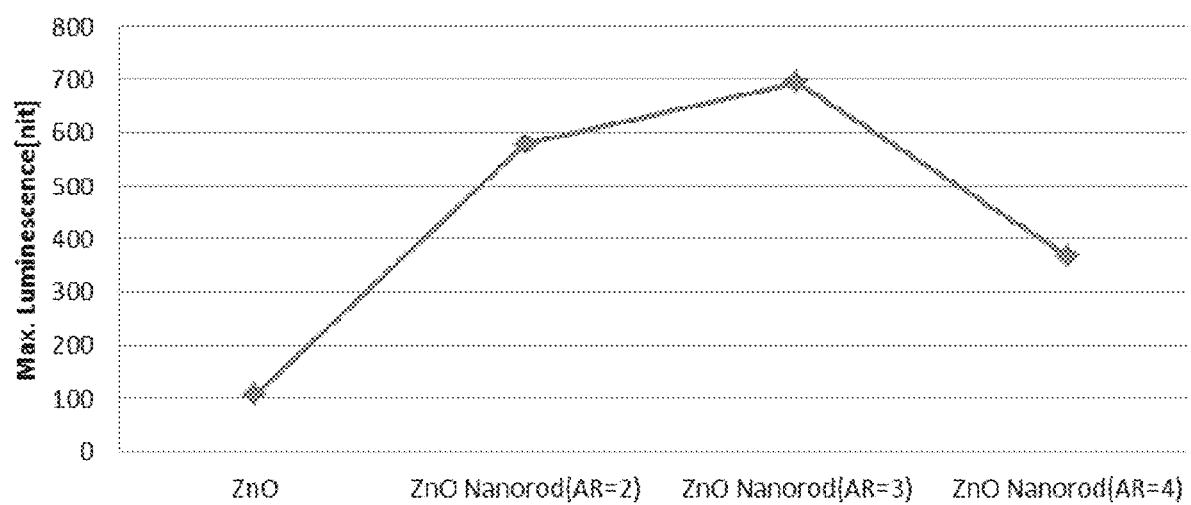
Figure 10A:
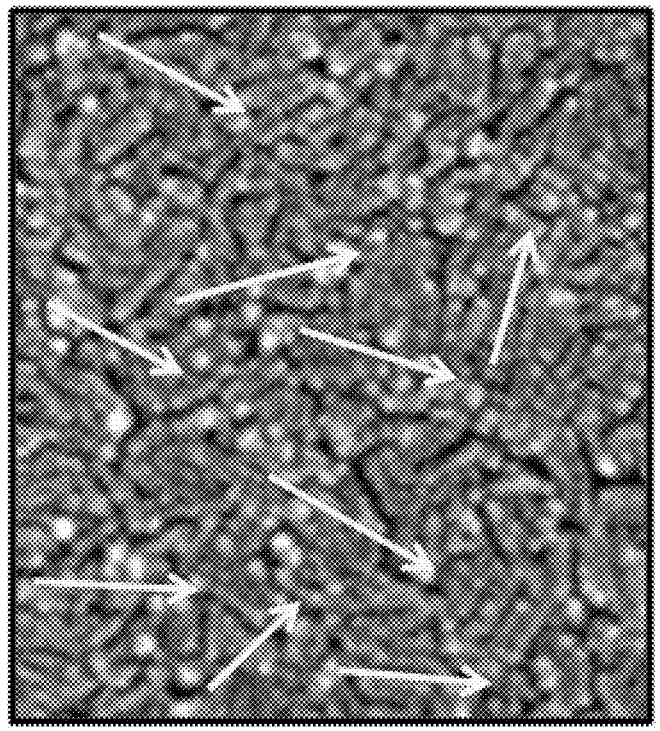
FIGS. 10A to 10G are electron microscope images each illustrating that the long axes of anisotropic nanorod-type inorganic particles are arranged at a predetermined angle with respect to an interface with a substrate according to an exemplary embodiment of the present disclosure.
Figure 10B:
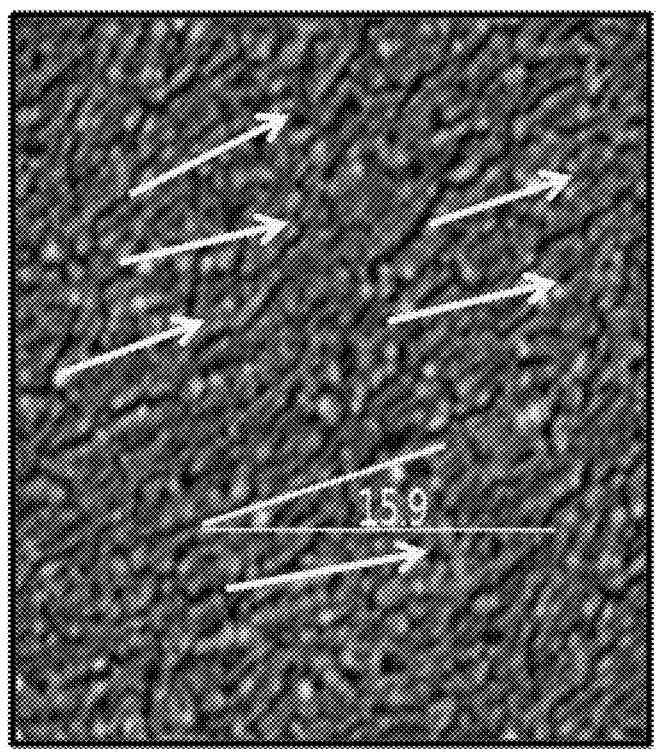
Figure 10C:
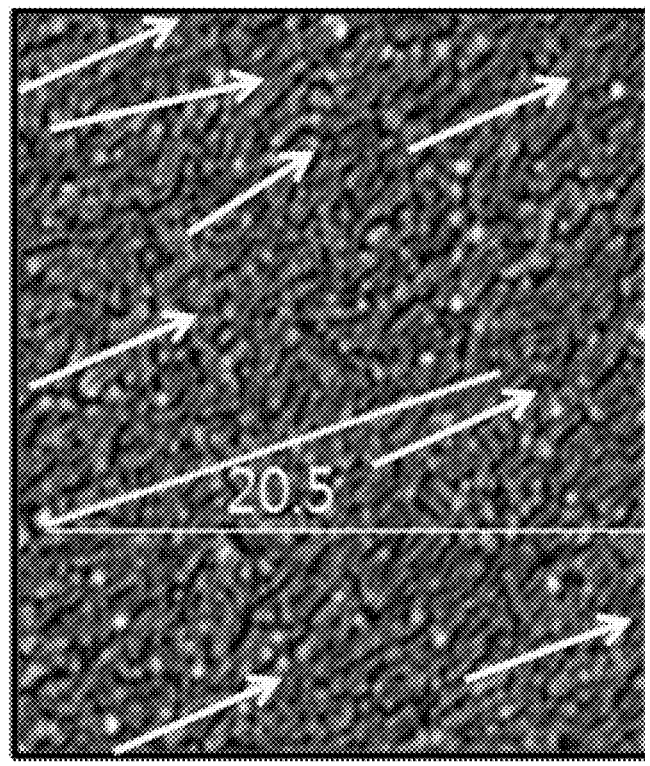
Figure 10D:
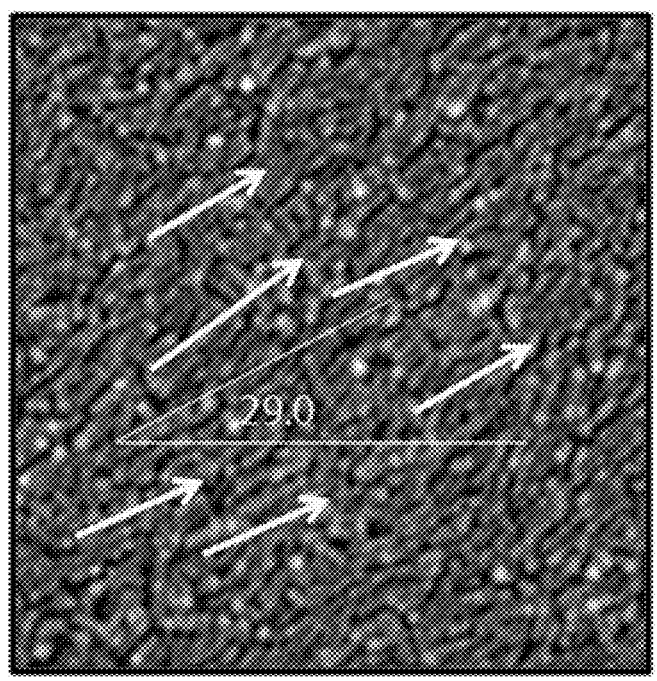
Figure 10E:
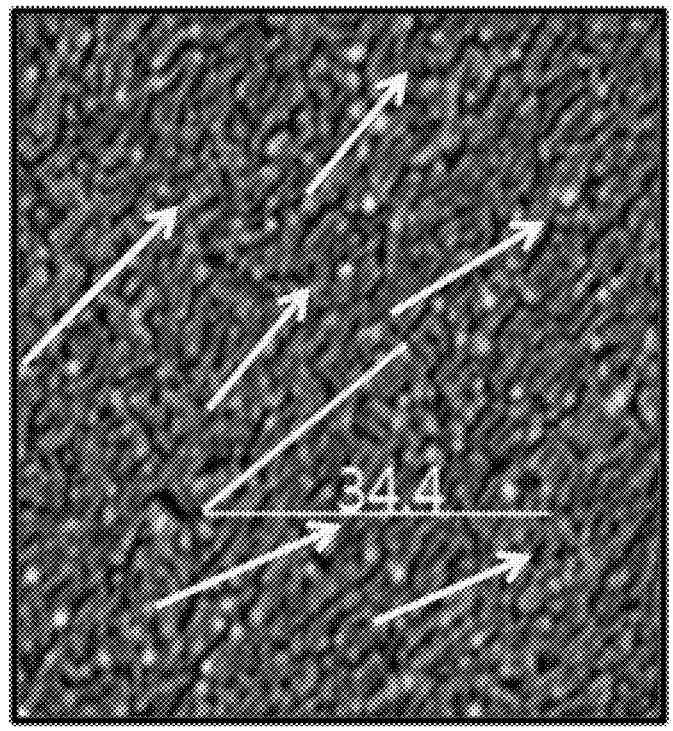
Figure 10F:
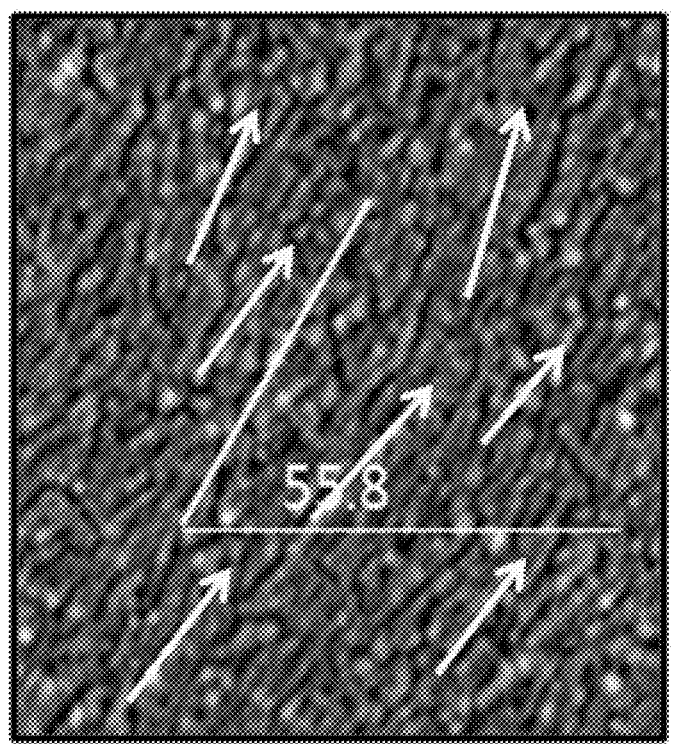
Figure 10G:
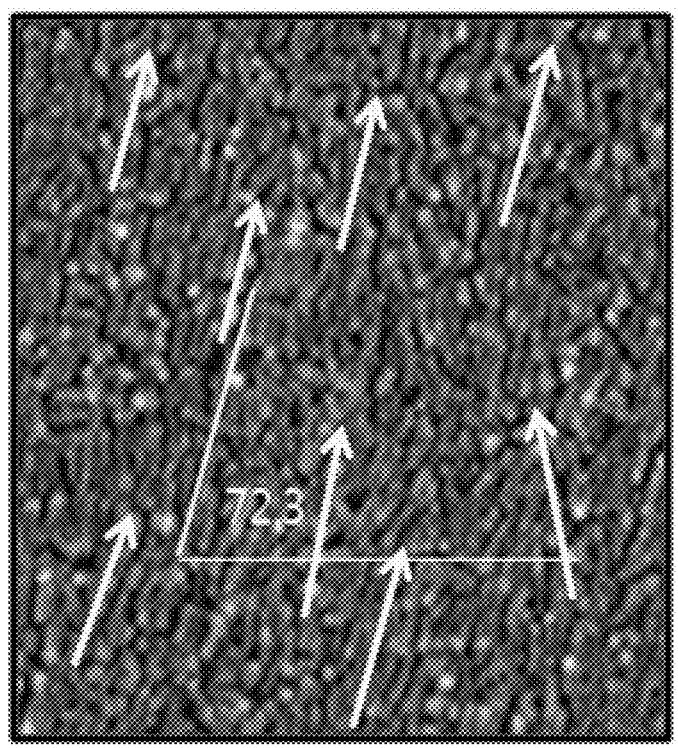

Therefore, according to the present disclosure, the electron transfer-induced light-emitting diode comprising anisotropic nanorod-type inorganic particles having a long axis arranged at a predetermined angle with respect to an electron-injected interface may be applied to a light-emitting device such as a lighting device or a display device. As an example, a light-emitting device including a light-emitting diode in which anisotropic nanorod-type inorganic particles are applied to an ETL according to the present disclosure will be described. FIG. 5 is a cross-sectional view schematically illustrating a light-emitting display device according to an exemplary embodiment of the present disclosure.

As illustrated in FIG. 5, the light-emitting display device 300 includes a substrate 310, a driving thin film transistor Tr, which is a driving element, disposed on the substrate 310, and a light-emitting diode 400 connected to the driving thin film transistor Tr.

A semiconductor layer 322 comprising an oxide semiconductor material or polycrystalline silicon is formed on the substrate 310. When the semiconductor layer 322 comprise an oxide semiconductor material, a light shielding pattern (not shown) may be formed under the semiconductor layer 322 to prevent light from being incident upon the semiconductor layer 322, thus preventing degradation of the semiconductor layer 322 due to light. Alternatively, the semiconductor layer 322 may comprise polycrystalline silicon, and in this case, opposite edges of the semiconductor layer 322 may be doped with impurities.

A gate insulating film 324 comprising an insulating material is formed on the semiconductor layer 322. The gate insulating film 324 may comprise an inorganic insulating material such as silicon oxide ($SiO_2$) or silicon nitride (SiNx). A gate electrode 330 comprising a conductive material such as a metal is formed on the gate insulating film 324 to correspond to the center of the semiconductor layer 322.

An interlayer insulating film 332 consisting of an insulating material is formed on the gate electrode 330. The interlayer insulating film 332 may be formed of an inorganic insulating material such as silicon oxide ($SiO_2$) or silicon nitride (SiNx), or an organic insulating material such as benzocyclobutene or photo-acryl.

The interlayer insulating film 332 has first and second semiconductor layer contact holes 334 and 336 exposing two opposite sides of the semiconductor layer 322. The first and second semiconductor layer contact holes 334 and 336 are disposed on two opposite sides of the gate electrode 330 such that they are spaced apart from the gate electrode 330. A source electrode 340 and a drain electrode 342, which comprise a conductive material such as a metal, are formed on the interlayer insulating film 332.

The source electrode 340 and the drain electrode 342 are disposed on the respective side of the gate electrode 330 such that they are spaced apart with respect to the center of the gate electrode 330, and are connected to two opposite sides of the semiconductor layer 322 via the first and second semiconductor layer contact holes 334 and 336, respectively.

The semiconductor layer 322, the gate electrode 330, the source electrode 340, and the drain electrode 342 constitute the driving thin film transistor Tr, which is a driving element.

In FIG. 5, the driving thin film transistor Tr has a coplanar structure in which the gate electrode 330, the source electrode 340 and the drain electrode 342 are disposed on the semiconductor layer 322. Alternatively, the driving thin film transistor Tr may have an inverted staggered structure in which a gate electrode is disposed under the semiconductor layer, and a source electrode and a drain electrode are disposed on the semiconductor layer. In this case, the semiconductor layer may comprise amorphous silicon.

In addition, pixel areas are defined by gate lines and data lines that cross one another, and a switching element connected to the gate line and the data line is further provided. The switching element is connected to the driving thin film transistor Tr, which is a driving element. In addition, a power line disposed spaced apart from and parallel to the gate line or data line, and a storage capacitor may be further included to constantly maintain a voltage of the gate electrode of the driving thin film transistor Tr, which is a driving element, during one frame.

Meanwhile, a passivation layer 350 having a drain contact hole 352 through which the drain electrode 342 of the driving thin film transistor Tr is exposed is formed in such a way that it covers the driving thin film transistor Tr. The passivation layer 350 may be formed of an inorganic insulating material such as a silicon oxide ($SiO_2$) or a silicon nitride (SiNx), or an organic insulating material such as benzocyclobutene or photo-acryl.

The light-emitting diode 400 is disposed on the passivation layer 350. Specifically, a first electrode 410 connected to the drain electrode 342 of the driving thin film transistor Tr though the drain contact hole 352 is formed on the passivation layer 350 so as to be divided for each pixel area. The first electrode 410 may be an anode or a cathode. The first electrode 410 may comprise a conductive material having a relatively high work function. For example, the first electrode 410 may comprise a doped or undoped metal oxide such as ITO, IZO, ITZO, ICO, $SnO_2$, $In_2O_3$, Cd:ZnO, $F:SnO_2$, $In:SnO_2$, $Ga:SnO_2$ or AZO, or, other than the above-mentioned metal oxides, it may comprise a metal material including nickel (Ni), platinum (Pt), gold (Au), silver (Ag), iridium (Ir) or a CNT.

Meanwhile, when the light-emitting device 300 of the present disclosure is a top-emission type device, a reflective electrode or a reflective layer may be further provided under the first electrode 410. For example, the reflective electrode or reflective layer may comprise an aluminum-palladium-copper (APC) alloy.

In addition, a bank layer 368 covering an edge of the first electrode 410 is formed on the passivation layer 350. The bank layer 368 is configured to expose the center of the first electrode 410 corresponding to a pixel area.

An emissive layer 430 is formed on the first electrode 410. The emissive layer 430 may consist only of an EML, or it may have multiple charge transfer layers to increase luminous efficiency. As an example, FIG. 5 illustrates that the emissive layer 430 comprises the first charge transfer layer 440, the EML 450 and the second charge transfer layer 460, which are sequentially stacked between the first electrode 410 and the second electrode 420.

For example, the first charge transfer layer 440 may be a hole transfer layer, composed of an HIL 142 (see FIG. 1) formed of an organic material or an inorganic material and an HTL 144 (see FIG. 1). The EML 450 may comprise inorganic luminescent particles or an organic light-emitting material. Meanwhile, the second charge transfer layer 460 may be an electron transfer layer, composed of an EIL 162 (see FIG. 1) and an ETL 164 (see FIG. 1).

For example, the second charge transfer layer 460 may include the ETL 164 (see FIG. 1) formed of an anisotropic nanorod 170-type inorganic material. The anisotropic nanorod 170 may have a long axis 172 and a short axis 174, in which the long axis 172 is arranged at an angle (θ) of approximately about 20 to about 90 degrees with respect to an electron-injected interface.

The second electrode 420 is formed on the emissive layer 430, which is formed above a substrate 310. The second electrode 420 may be a cathode or anode. The second electrode 420 may be disposed on the entire surface of a display region, and may be formed of a conductive material having a relatively small work function. For example, the second electrode 420 may be Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

FIG. 5 illustrates the light-emitting diode 400 having a normal structure, in which the first charge transfer layer 440 as a hole transfer layer is disposed between the first electrode 410 and the emitting material layer 450, and the second charge transfer layer 460 as an electron transfer layer is disposed between the second electrode 420 and the emitting material layer 450.

In the light-emitting diode 400 having a normal structure, since the second charge transfer layer 460 disposed between the EML 450 and the second electrode 420 is formed of an inorganic material such as metal oxide having a deep VB energy level, holes injected into the EML 450 may be effectively blocked in the second charge transfer layer 460. The long axes of the anisotropic nanorod 170 constituting the second charge transfer layer 460 are arranged as perpendicular as possible to an electron-injected interface. As trap sites of electrons injected into the first charge transfer layer 460 are reduced, electron mobility is improved, and an electron drift distance increases. The efficiency and velocity of electron injection into the EML 450 are enhanced, and thus the luminescence properties of the light-emitting diode 400 and the light-emitting display device 300 including the same may be improved.

In another embodiment, a light-emitting diode having an inverted structure in which a first charge transfer layer as an electron transfer layer is disposed between the first electrode 410 and the emitting material layer 450, and a second charge transfer layer as a hole transfer layer is disposed between the second electrode 420 and the emitting material layer 450 may be manufactured. In this case, the ETL formed of an anisotropic nanorod 170-type inorganic material may be included in the first charge transfer layer 440 disposed between the first electrode 410 and the EML 450.

In the light-emitting diode having an inverted structure, since the first charge transfer layer 440 disposed between the EML 450 and the first electrode 410 is formed of an inorganic material such as a metal oxide having a deep VB energy level, holes injected into the EML 450 may be effectively blocked in the first charge transfer layer 440. The long axes of the anisotropic nanorods 170 constituting the first charge transfer layer 440 are arranged as perpendicular as possible to an electron-injected interface. As trap sites of electrons injected into the first charge transfer layer 440 are reduced, electron mobility is improved, and an electron drift distance increases. The efficiency and velocity of electron injection into the EML 450 are enhanced, and thus the luminescence properties of the light-emitting diode 400 and the light-emitting display device 300 including the same may be improved.

Hereinafter, the present disclosure will be described through the following examples, but the present disclosure is not limited to the technical ideas described in the following examples.

Example 1: Manufacture of Light-Emitting Diode

Zinc oxide (ZnO) particles having an average aspect ratio (AR) of the long axis to the short axis of 2 as anisotropic nanorod-type inorganic particles were purchased commercially and applied to an ETL of a light-emitting diode. Particularly, patterning of an ITO glass was performed to have an emission area of 3 mm×3 mm, and then washed. Subsequently, an emissive layer and a cathode were stacked according to the following order: an HIL (PEDOT:PSS, spin coating (5000 rpm) and then heating at 150° C. for 30 minutes; 30 nm), an HTL (spin coating (4000 rpm) of TFB (8 mg/mL in toluene), and then heating at 180° C. for 30 minutes; 20 nm), an EML (spin coating (3000 rpm) of InP-based red QDs (10 mg/mL in hexane) and then heating at 80° C. for 30 minutes; 20 nm), an ETL (spin coating of ZnO having an AR of 2 (12.5 mg/mL in ethanol), and then heating at 80° C. for 30 minutes; 20 nm).

The substrate on which the emissive layer is formed as described above was mounted in a vacuum chamber, and a cathode (Al; 80 nm) was deposited at a base pressure of $1 \times 10^{-6}$ Torr. After deposition, for film formation, the substrate was transferred into a dry box from a deposition chamber, followed by encapsulation using UV-curable epoxy and a moisture getter. The resulting light-emitting diode has an emission area of 9 mm$^2$.

Example 2: Manufacture of Light-Emitting Diode

A light-emitting diode was manufactured in the same manner as described in Example 1, except that anisotropic nanorod (NR)-type ZnO particles having an AR of 3 as inorganic particles of an ETL were used.

Example 3: Manufacture of Light-Emitting Diode

A light-emitting diode was manufactured in the same manner as described in Example 1, except that anisotropic nanorod (NR)-type ZnO particles having an AR of 4 as inorganic particles of an ETL were used.

Comparative Example 1: Manufacture of Light-Emitting Diode

A light-emitting diode was manufactured in the same manner as described in Example 1, except that isotropic nanodot-type ZnO particles as inorganic particles of an ETL were used.

Experimental Example 1: Evaluation of Physical Properties of Light-Emitting Diodes Each of the light-emitting diodes manufactured according to Examples 1 to 3 and Comparative Example 1 was connected to an external power source, electroluminescence (EL) properties of all diodes manufactured in the present disclosure were evaluated at room temperature using a constant current source (KEITHLEY) and a photometer PR650. Particularly, voltage (V)-luminescence (L; nit), voltage (V)-current density (mA/cm$^2$), EL intensity and maximum luminescence of the light-emitting diodes manufactured in Examples 1 to 3 and Comparative Example 1 were measured. The measurement results are shown in Table 1 below and FIGS. 6 to 9.

TABLE 1

EL properties of light-emitting diodes

| Sample | ETL | nit* | mA/cm$^2$* | mA/cm$^2$** | EL*** |
|---|---|---|---|---|---|
| Example 1 | NR (AR = 2) | 578.16 | 515.57 | 836.76 | 0.3185 |
| Example 2 | NR (AR = 3) | 693.79 | 567.12 | 920.43 | 0.03822 |
| Example 3 | NR (AR = 4) | 367.71 | — | — | — |
| Comparative Example 1 | Nanodot | 106.17 | 422.26 | 793.6 | 0.004794 |

*5 V,
**6 V,
***640 nm

As shown in Table 1 and FIGS. 6 to 9, compared with the light-emitting diode including the ETL formed of the isotropic nanodot-type ZnO particles, in the light-emitting diode including the ETL formed of the anisotropic nanorod-type ZnO particles, the luminescence increased up to 6.53 times, the current density increased up to 1.34 times, and the EL intensity increased up to 7.98 times. Therefore, it was confirmed that when the anisotropic nanorod-type inorganic particles are formed in the ETL, a light-emitting diode having improved luminescence properties can be realized.

Example 4: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating, and then heating at 100° C. for 30 minutes.

Example 5: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating, and then heating at 80° C. for 30 minutes.

Example 6: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating and heating at 70° C. for 5 minutes and then at 80° C. for 30 minutes.

Example 7: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating and heating at 70° C. for 10 minutes and then at 80° C. for 20 minutes.

Example 8: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating and heating at 60° C. for 10 minutes and then at 80° C. for 20 minutes.

Example 9: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating and heating at 50° C. for 10 minutes, at 70° C. for 10 minutes and then at 80° C. for 20 minutes.

Example 10: Manufacture of Light-Emitting Diode

A light-emitting diode was manufactured in the same manner as described in Example 1, except that anisotropic nanorod (NR)-type ZnO particles having an AR of 3 as inorganic particles of an ETL were applied onto an EML by spin coating and heating at 30° C. for 20 minutes, at 50° C. for 10 minutes and then at 80° C. for 20 minutes.

Comparative Example 2: Manufacture of Light-Emitting Diode

A light-emitting diode was manufactured in the same manner as described in Example 1, except that isotropic nanodot-type ZnO particles as inorganic particles of an ETL were applied onto an EML by spin coating and heating at 80° C. for 30 minutes.

Figure 11:
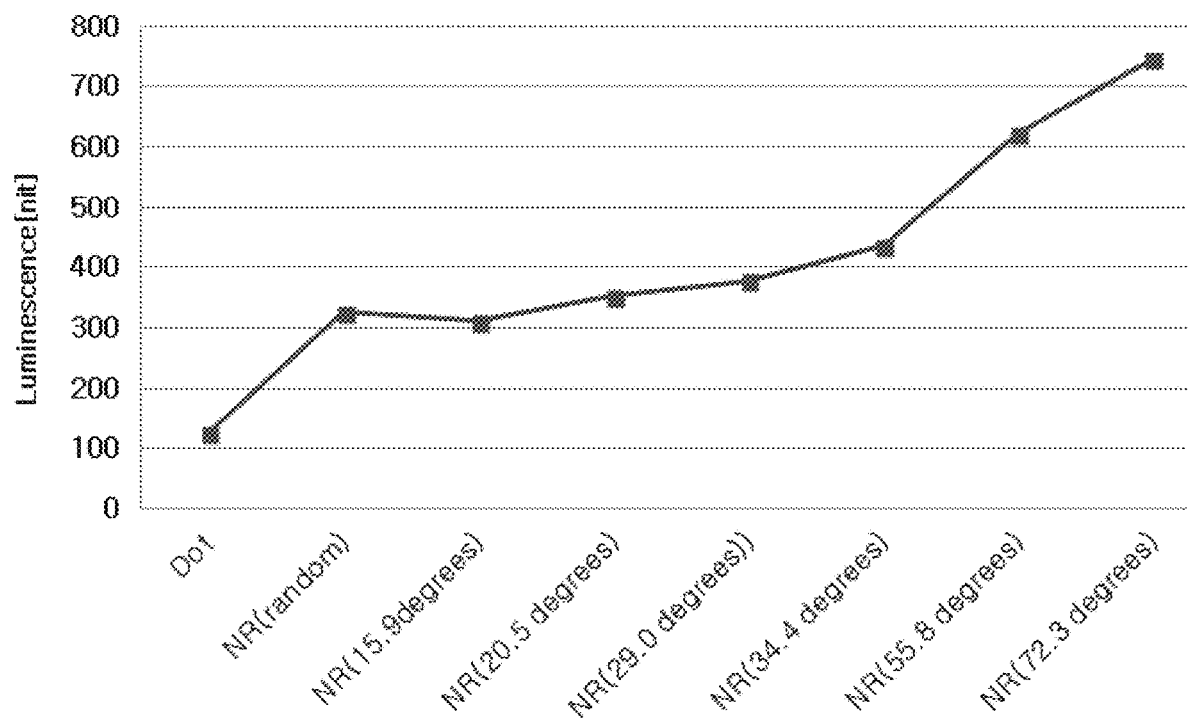
FIG. 11 is a graph of luminescence according to an angle between the long axis of anisotropic nanorod-type inorganic particles and an interface with a substrate according to an exemplary embodiment of the present disclosure. NR represents that anisotropic nanorods are used.

Experimental Example 2: Evaluation of Physical Properties of Light-Emitting Diodes In each of the light-emitting diodes manufactured in Examples 4 to 10 and Comparative Example 2, a direction of long axis arrangement of anisotropic nanorod particles with respect to an interface into which electrons are injected to form an ETL was detected using an electron microscope, and the luminescence of each of the light-emitting diodes manufactured in the examples and the comparative example was measured. The results of measuring the direction of arrangement of the long axes of the anisotropic nanorods are shown in FIGS. 10A to 10G, and the result of measuring the luminescence is shown in FIG. 11. In addition, the measurement results of this experimental example are summarized in Table 2 below.

TABLE 2

EL properties of light-emitting diodes

| Sample | ETL | Baking | Long axis arrangement (°) | Luminescence (nit) |
|---|---|---|---|---|
| Example 4 | NR ZnO | 100° C./30 min | Random | 326 |
| Example 5 | NR ZnO | 80° C./30 min | 15.9 | 312 |
| Example 6 | NR ZnO | 70° C./5 min → 80° C./30 min | 20.5 | 353 |
| Example 7 | NR ZnO | 70° C./10 min → 80° C./20 min | 29 | 378 |
| Example 8 | NR ZnO | 60° C./10 min → 80° C./20 min | 34.4 | 436 |
| Example 9 | NR ZnO | 50° C./10 min → 70° C./10 min → 80° C./20 min | 55.8 | 623 |

TABLE 2-continued

EL properties of light-emitting diodes

| Sample | ETL | Baking | Long axis arrangement (°) | Luminescence (nit) |
|---|---|---|---|---|
| Example 10 | NR ZnO | 30° C./20 min → 50° C./10 min → 80° C./20 min | 72.3 | 746 |
| Comparative Example 2 | Dot ZnO | 80° C./30 min | — | 126 |

As shown in Table 2, FIGS. 10A to 10G and FIG. 11, by applying the anisotropic nanorod-type ZnO particles onto the substrate, and varying baking conditions, an ETL in which the long axes of anisotropic nanorods were arranged almost perpendicular to an electron-injected interface may be formed. As the long axes of anisotropic nanorods were arranged almost perpendicular to the electron-injected interface, the luminescence of a light-emitting diode increased. Particularly, in the case in which the long axes of anisotropic nanorods are arranged almost perpendicular to the electron-injected interface, compared with the case in which isotropic nanodots are applied, a luminescence increased 5.92 times, and compared with the case in which the long axes of anisotropic nanorods were randomly arranged, a luminescence was improved up to 2.29 times. Therefore, it was confirmed that, as the long axes of anisotropic nanorods were arranged almost perpendicularly, the luminescence properties of a light-emitting diode can be improved.

In a light-emitting diode according to the present disclosure, anisotropic nanorod-type inorganic particles are applied to an electron transfer layer. Compared with isotropic nanodot-shaped inorganic particles, the anisotropic nanorods have a smaller interface with adjacent particles at the same volume. Therefore, during the transfer of electrons generated in a cathode to an EML, at the interface between the anisotropic nanorod-type inorganic particles constituting the electron transfer layer, contact points with the electrons, that is, electron trap sites, are reduced, and an electron injection property and electron mobility can be improved.

In addition, in the present disclosure, when the anisotropic nanorod-type inorganic particles form an electron transfer layer, the long axes of the anisotropic nanorods are arranged to have a predetermined angle or more with respect to an interface between the electron transport layer and an adjacent layer, for example, an EML. Light emitted from the EML is emitted to the outside along the long axes of the nanorods arranged at a predetermined angle or more with respect to the interface, thereby improving luminescence.

Therefore, as the electron transfer layer comprising the anisotropic nanorod-type inorganic particles whose long axes are arranged at a predetermined angle or more with respect to the interface with the adjacent layer is applied, a light-emitting diode and a light-emitting device, which have improved luminescence properties such as luminance, current density, etc.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present invention cover the modifications and variations of the present disclosure provided they come within the scope of the appended claims and their equivalents.

What is claimed is:

1. A light-emitting diode, comprising:
a first electrode and a second electrode facing each other;
a light emitting material layer between the first electrode and the second electrode,
an electron transfer layer disposed between the light emitting material layer and the second electrode, and formed of a blend of cesium carbonate with anisotropic nanorod type metal oxide particles; and
a hole blocking layer disposed between the light emitting material layer and the electron transfer layer,
wherein long axes of the anisotropic nanorod type metal oxide particles are arranged at an angle of about 20 degrees to about 72 degrees with respect to an interface with an adjacent layer into which electrons are injected,
wherein an upper surface the electron transfer layer is directly contacted to the second electrode, and
wherein the second electrode consists of Ca, Ba, Ca/Al, LiF/Ca, LiF/Al, BaF$_2$/Al, CsF/Al, CaCO$_3$/Al, BaF$_2$/Ca/Al, Al, Mg, Au:Mg or Ag:Mg.

2. The light-emitting diode according to claim 1, wherein an aspect ratio of the long axes to a short axes of the anisotropic nanorod type metal oxide particles ranges from about 2:1 to about 4:1.

3. The light-emitting diode according to claim 1, wherein the anisotropic nanorod type metal oxide particles are selected from the group consisting of zinc oxide (ZnO), zinc magnesium oxide (ZnMgO), titanium dioxide (TiO$_2$), magnesium oxide (MgO), zirconium dioxide (ZrO$_2$), tin oxide (SnO), tin dioxide (SnO$_2$), tungsten oxide (WO$_3$), tantalum oxide (Ta$_2$O$_3$), hafnium oxide (HfO$_3$), aluminum oxide (Al$_2$O$_3$), zirconium silicon oxide (ZrSiO$_4$), barium titanium oxide (BaTiO$_3$), and barium zirconium oxide (BaZrO$_3$) and combinations thereof.

4. The light-emitting diode according to claim 1, wherein the light emitting material layer is between the first electrode and the electron transfer layer, and
wherein a luminescence of the light emitting diode is most improved at the angle of about 72 degrees.

5. The light-emitting diode according to claim 1, wherein the light emitting material layer comprises inorganic luminescent particles.

6. The light-emitting diode according to claim 5, wherein the inorganic luminescent particles comprises quantum dots or quantum rods.

7. The light-emitting diode according to claim 1, wherein the light emitting material layer comprises an organic light-emitting material.

8. The light-emitting diode of claim 1, wherein the electron transfer layer comprises an electron transport layer,
wherein the electron transport layer comprises the anisotropic nanorod type metal oxide particles, and
wherein an upper surface of the electron transport layer is directly contacted to the second electrode.

9. A light-emitting device, comprising:
a substrate; and
a light-emitting diode on the substrate,
wherein the light-emitting diode comprises:
a first electrode and a second electrode facing each other;
a light emitting material layer between the first electrode and the second electrode;
an electron transfer layer disposed between the light emitting material layer and the second electrode, and formed of a blend of cesium carbonate with anisotropic nanorod type metal oxide particles; and
a hole blocking layer disposed between the light emitting material layer and the electron transfer layer,
wherein long axes of the anisotropic nanorod type metal oxide particles are arranged at an angle of about 20 degrees to about 72 degrees with respect to an interface with an adjacent layer into which electrons are injected,
wherein an up surface of the electron transfer layer is directly contacted to the second electrode, and
wherein the second electrode consists of Ca, Ba, Ca/Al, LiF/Ca, LiF/Al, BaF$_2$/Al, CsF/Al, CaCO$_3$/Al, BaF$_2$/Ca/Al, Al, Mg, Au:Mg or Ag:Mg.

10. The light-emitting device according to claim 9, wherein an aspect ratio of a long axis to a short axis of the anisotropic nanorod type metal oxide particles ranges from about 2:1 to about 4:1.

11. The light-emitting device according to claim 9, wherein the anisotropic nanorod type metal oxide particles are selected from the group consisting of zinc oxide (ZnO), zinc magnesium oxide (ZnMgO), titanium dioxide (TiO$_2$), magnesium oxide (MgO), zirconium dioxide (ZrO$_2$), tin oxide (SnO), tin dioxide (SnO$_2$), tungsten oxide (WO$_3$), tantalum oxide (Ta$_2$O$_3$), hafnium oxide (HfO$_3$), aluminum oxide (Al$_2$O$_3$), zirconium silicon oxide (ZrSiO$_4$), barium titanium oxide (BaTiO$_3$), and barium zirconium oxide (BaZrO$_3$) and combinations thereof.

12. The light-emitting device according to claim 9, wherein the light emitting material layer is between the first electrode and the electron transfer layer, and
wherein a luminescence of the light emitting diode is most improved at the angle of about 72 degrees.

13. The light-emitting device according to claim 9, wherein the emitting material layer comprises inorganic luminescent particles.

14. The light-emitting device according to claim 9, wherein the light emitting material layer comprises an organic light-emitting material.

15. The light-emitting device according to claim 9, wherein the first electrode is an anode and the second electrode is a cathode, and
wherein light from the light emitting diode is passed through the cathode.

16. The light-emitting device of claim 9, wherein the electron transfer layer comprises an electron transport layer,
wherein the electron transport layer comprises the anisotropic nanorod type metal oxide particles; and
wherein an upper surface of the electron transport layer is directly contacted to the second electrode.

17. A light-emitting diode, comprising:
a first electrode and a second electrode facing each other;
a light emitting material layer between the first electrode and the second electrode;
an electron transfer layer disposed between the light emitting material layer and the second electrode and formed of a blend of cesium carbonate with anisotropic nanorod type metal oxide particles; and
a hole blocking layer disposed between the light emitting material layer and the electron transfer layer,
wherein long axes of the anisotropic nanorod type oxide particles are arranged at an angle of about 20 degrees to about 72 degrees with respect to an interface with an adjacent layer into which electrons are injected,
wherein an upper surface of the electron transfer layer is directly contacted to the second electrode, and
wherein the second electrode has a mono-layered structure.

18. A light-emitting device, comprising:
a substrate; and
a light-emitting diode on the substrate,
wherein the light-emitting diode comprises:
- a first electrode and a second electrode facing each other;
- a light emitting material layer between the first electrode and the second electrode;
- an electron transfer layer disposed between the light emitting material layer and the second electrode and formed of a blend of cesium carbonate and anisotropic nanorod type metal oxide particles; and
- a hole blocking layer disposed between the light emitting material layer and the electron transfer layer, wherein long axes of the anisotropic nanorod type metal oxide particles are arranged at an angle of about 20 degrees to about 72 degrees with respect to an interface with an adjacent layer into which electrons are injected,
wherein an upper surface of the electron transfer layer is directly contacted to the second electrode, and
wherein the second electrode has a mono-layered structure.

* * * * *